US012607581B2

(12) United States Patent
Burgess et al.

(10) Patent No.: US 12,607,581 B2
(45) Date of Patent: Apr. 21, 2026

(54) MATERIAL ANALYSIS WITH MULTIPLE DETECTORS

(71) Applicant: OXFORD INSTRUMENTS NANOTECHNOLOGY TOOLS LIMITED, Abingdon (GB)

(72) Inventors: Simon Burgess, High Wycombe (GB); Santokh Bhadare, High Wycombe (GB); Chris Tyrrell, High Wycombe (GB); Peter Statham, High Wycombe (GB)

(73) Assignee: OXFORD INSTRUMENTS NANOTECHNOLOGY TOOLS LIMITED, High Wycombe (GB)

( * ) Notice: Subject to any disclaimer, the term of this patent is extended or adjusted under 35 U.S.C. 154(b) by 600 days.

(21) Appl. No.: 18/014,975

(22) PCT Filed: Jul. 8, 2021

(86) PCT No.: PCT/GB2021/051752
§ 371 (c)(1),
(2) Date: Jan. 6, 2023

(87) PCT Pub. No.: WO2022/008924
PCT Pub. Date: Jan. 13, 2022

(65) Prior Publication Data
US 2023/0258587 A1 Aug. 17, 2023

(30) Foreign Application Priority Data

Jul. 9, 2020 (GB) ...................................... 2010590
Jul. 29, 2020 (GB) ...................................... 2011809

(51) Int. Cl.
*G01N 23/2208* (2018.01)
*G01N 23/203* (2006.01)
(Continued)

(52) U.S. Cl.
CPC ....... *G01N 23/2208* (2013.01); *G01N 23/203* (2013.01); *G01N 23/2252* (2013.01);
(Continued)

(58) Field of Classification Search
CPC ............. G01N 23/2208; G01N 23/203; G01N 23/2252; G01N 23/2254; G01N 2223/079;
(Continued)

(56) References Cited

U.S. PATENT DOCUMENTS 3,329,813 A * 7/1967 Hashimoto .......... G01N 23/203
219/121.3
5,466,940 A * 11/1995 Litman ................. H01J 37/244
250/397
(Continued)

FOREIGN PATENT DOCUMENTS

CN 102575994 A 7/2012
CN 108028161 A 5/2018
(Continued)

OTHER PUBLICATIONS

Micron Semiconductor Catalogue: http://79.170.44.80/micronsemiconductor.co.uk/wp-content/uploads/2017/03/MSL-OEM-Catalogues.pdf.
(Continued)

*Primary Examiner* — David A Vanore
(74) *Attorney, Agent, or Firm* — Blank Rome LLP

(57) ABSTRACT
A detector module for use in an apparatus for analysing a specimen is provided. The detector module comprises a plurality of X-ray sensor elements and one or more electron sensor elements, and is adapted to be positioned below a polepiece of an electron beam assembly of the apparatus from which an electron beam generated by the assembly emerges towards a specimen in use, such that the detector
(Continued)

module receives X-rays and backscattered electrons generated by interaction between the electron beam and the specimen. Each of the plurality of X-ray sensor elements is configured to monitor energies of individual received X-ray photons, and the plurality of X-ray sensor elements have a total active area greater than 20 mm². The radial extent of the detector module with respect to the electron beam axis in use is less than 10 mm for at least a first portion of the detector module. An apparatus and method for analysing a specimen are also provided.

16 Claims, 18 Drawing Sheets

(51) Int. Cl.

| | | |
|---|---|---|
| *G01N 23/2252* | (2018.01) | |
| *G01N 23/2254* | (2018.01) | |
| *H01J 37/244* | (2006.01) | |

(52) U.S. Cl.
CPC ........ *G01N 23/2254* (2013.01); *H01J 37/244* (2013.01); *G01N 2223/079* (2013.01); *G01N 2223/401* (2013.01); *G01N 2223/402* (2013.01); *G01N 2223/418* (2013.01); *H01J 2237/221* (2013.01)

(58) Field of Classification Search
CPC ....... G01N 2223/401; G01N 2223/402; G01N 2223/418; H01J 37/244; H01J 2237/221; H01J 2237/2442; H01J 2237/2446
See application file for complete search history.

(56) References Cited

U.S. PATENT DOCUMENTS

| | | | | |
|---|---|---|---|---|
| 5,644,132 | A * | 7/1997 | Litman ................. | H01J 37/244 250/397 |
| 9,564,291 | B1 * | 2/2017 | Own ....................... | C23C 14/24 |
| 2008/0185509 | A1 * | 8/2008 | Knowles ............... | H01J 37/256 250/251 |
| 2012/0160999 | A1 | 6/2012 | Zaluzec | |
| 2013/0146765 | A1 * | 6/2013 | Kitayama ........... | H01J 37/3056 250/311 |
| 2013/0299698 | A1 | 11/2013 | Schamber et al. | |
| 2014/0226789 | A1 * | 8/2014 | Bendahan ............ | G01N 23/203 378/86 |
| 2015/0243474 | A1 * | 8/2015 | Lazic ..................... | H01J 37/28 250/311 |
| 2016/0189922 | A1 * | 6/2016 | Kooijman ........... | G01N 23/223 250/307 |
| 2016/0233051 | A1 * | 8/2016 | Statham ................. | H01J 37/28 |
| 2017/0125209 | A1 * | 5/2017 | De Boeij ............. | H01J 37/268 |
| 2017/0138870 | A1 * | 5/2017 | Buijsse .................. | H01J 37/28 |
| 2018/0033589 | A1 * | 2/2018 | Schamber .............. | H01J 37/20 |
| 2018/0100815 | A1 * | 4/2018 | Stejskal .................. | G21K 7/00 |
| 2018/0217059 | A1 * | 8/2018 | Barbi ........................ | G01J 1/42 |
| 2023/0258587 | A1 * | 8/2023 | Burgess ............... | H01J 37/244 250/307 |
| 2024/0339293 | A1 * | 10/2024 | Statham ............... | H01J 37/265 |
| 2025/0069844 | A1 * | 2/2025 | Hlavenka ............. | H01J 37/244 |
| 2025/0259322 | A1 * | 8/2025 | Schwarz ................. | G03F 1/72 |

FOREIGN PATENT DOCUMENTS

| | | | | |
|---|---|---|---|---|
| CN | 108352284 | A | 7/2018 | |
| CN | 110 376 229 | A | 10/2019 | |
| DE | 102009024928 | B4 * | 7/2012 | ............. H01J 37/28 |
| EP | 2417618 | A1 | 2/2012 | |
| JP | 6035448 | A | 2/1985 | |
| JP | 01241745 | A | 9/1989 | |
| JP | 0322338 | A | 1/1991 | |
| JP | 0348852 | A | 5/1991 | |
| JP | 06162987 | A | 6/1994 | |
| JP | 0883588 | A | 3/1996 | |
| JP | 0982261 | A | 3/1997 | |
| JP | 2006173021 | A | 6/2006 | |
| JP | 2013541799 | A | 11/2013 | |
| JP | 2017500722 | A | 1/2017 | |
| KR | 20130125001 | A | 11/2013 | |

OTHER PUBLICATIONS

Wikipedia Entry: https://en.wikipedia.org/wiki/Scanning_electron_microscope#/Detection_of_backscattered_electrons.
H. Soltau et al., Microsc. Microanal. 15 (Suppl 2), pp. 204-205, 2009.
International Search Report and Written Opinion of PCT/GB2021/051752, dated Sep. 30, 2021.
Liebel et al., "Concepts for an Annular Pole Piece Detector for the Simultaneous Measurement of X-Rays and Backscattered Electrons Inside a SEM," *Microsc. Microanal.* 20 (Suppl 3), 2014.
Notification of Reason for Rejection for Japanese Application No., 2023-501065, 3 pages, mailed Mar. 13, 2025.
Office Action received in corresponding Chinese Patent Application No. 202180056178.6 dated Nov. 13, 2025.

* cited by examiner

Fig.1
Prior Art
<u>100</u>
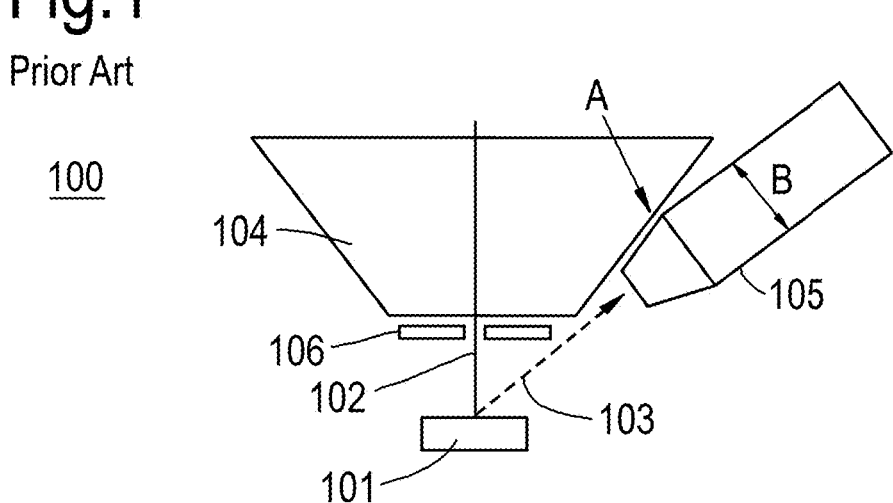
Fig.2
Prior Art
Fig.3
Prior Art
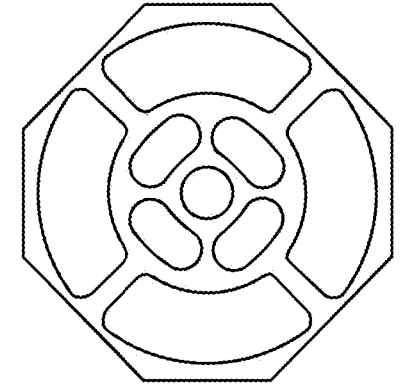
Electron beam
BSE Detector
EDX Detector
Collimator
with filter foils
Sample C10H804 Density = 1.4    Thickness = 6. microns SEM pole-piece for final lens Focussed electron beam Support arm and conduit for electrical connections Sensor module Sensor 1 collection solid angle 1 sensor 2 collection solid angle 2 central position

Specimen support stage deflected position of electron beam

| | | | | | | | | |
|---|---|---|---|---|---|---|---|---|
| 1.033 | 1.025 | 1.017 | 1.009 | 1.001 | 0.993 | 0.985 | 0.977 | 0.970 |
| 1.025 | 1.019 | 1.013 | 1.007 | 1.001 | 0.995 | 0.989 | 0.983 | 0.977 |
| 1.016 | 1.012 | 1.008 | 1.004 | 1.000 | 0.996 | 0.992 | 0.988 | 0.984 |
| 1.008 | 1.006 | 1.004 | 1.002 | 1.000 | 0.998 | 0.996 | 0.994 | 0.992 |
| 1.000 | 1.000 | 1.000 | 1.000 | 1.000 | 1.000 | 1.000 | 1.000 | 1.000 |
| 0.992 | 0.994 | 0.996 | 0.998 | 1.000 | 1.002 | 1.004 | 1.006 | 1.008 |
| 0.984 | 0.988 | 0.992 | 0.996 | 1.000 | 1.004 | 1.008 | 1.012 | 1.016 |
| 0.977 | 0.983 | 0.989 | 0.995 | 1.001 | 1.007 | 1.013 | 1.019 | 1.025 |
| 0.970 | 0.977 | 0.985 | 0.993 | 1.001 | 1.009 | 1.017 | 1.025 | 1.033 |

Fig.13

| | | | | | | | | |
|---|---|---|---|---|---|---|---|---|
| 1.002 | 1.002 | 1.002 | 1.002 | 1.002 | 1.002 | 1.002 | 1.002 | 1.002 |
| 1.001 | 1.001 | 1.001 | 1.001 | 1.001 | 1.001 | 1.001 | 1.001 | 1.001 |
| 1.000 | 1.000 | 1.000 | 1.000 | 1.000 | 1.000 | 1.000 | 1.000 | 1.000 |
| 1.000 | 1.000 | 1.000 | 1.000 | 1.000 | 1.000 | 1.000 | 1.000 | 1.000 |
| 1.000 | 1.000 | 1.000 | 1.000 | 1.000 | 1.000 | 1.000 | 1.000 | 1.000 |
| 1.000 | 1.000 | 1.000 | 1.000 | 1.000 | 1.000 | 1.000 | 1.000 | 1.000 |
| 1.000 | 1.000 | 1.000 | 1.000 | 1.000 | 1.000 | 1.000 | 1.000 | 1.000 |
| 1.001 | 1.001 | 1.001 | 1.001 | 1.001 | 1.001 | 1.001 | 1.001 | 1.001 |
| 1.002 | 1.002 | 1.002 | 1.002 | 1.002 | 1.002 | 1.002 | 1.002 | 1.002 |

Fig.14

| | | | | | | | | |
|---|---|---|---|---|---|---|---|---|
| 0.996 | 0.999 | 1.001 | 1.002 | 1.002 | 1.002 | 1.001 | 0.999 | 0.996 |
| 0.995 | 0.998 | 1.000 | 1.001 | 1.001 | 1.001 | 1.000 | 0.998 | 0.995 |
| 0.994 | 0.997 | 0.999 | 1.000 | 1.001 | 1.000 | 0.999 | 0.997 | 0.994 |
| 0.994 | 0.996 | 0.999 | 1.000 | 1.000 | 1.000 | 0.998 | 0.996 | 0.994 |
| 0.993 | 0.996 | 0.998 | 1.000 | 1.000 | 1.000 | 0.998 | 0.996 | 0.993 |
| 0.994 | 0.996 | 0.998 | 1.000 | 1.000 | 1.000 | 0.999 | 0.996 | 0.994 |
| 0.994 | 0.997 | 0.999 | 1.000 | 1.001 | 1.000 | 0.999 | 0.997 | 0.994 |
| 0.995 | 0.998 | 1.000 | 1.001 | 1.001 | 1.001 | 1.000 | 0.998 | 0.995 |
| 0.996 | 0.999 | 1.001 | 1.002 | 1.002 | 1.002 | 1.001 | 0.996 | 0.996 |

X-ray detector

Electron Trap

Electron Beam

Retractable arm for electrical connections and cooling path to external heat sink Detector module facing specimen Specimen electron beam Detector module with sensors facing specimen specimem auxiliary detector electron trap

MATERIAL ANALYSIS WITH MULTIPLE DETECTORS

CROSS-REFERENCE TO RELATED APPLICATIONS

This application is a national stage application of PCT/GB2021/051752, filed on Jul. 8, 2021, which claims priority to GB Patent Application Serial No. 2010590.4, filed Jul. 9, 2020 and GB Patent Application Serial No. 2011809.7, filed Jul. 29, 2020, all of which are hereby incorporated herein by reference in their entirety.

FIELD OF THE INVENTION

The present invention relates to an apparatus and method for analysis of materials in a scanning electron microscope that combines information from multiple X-ray and electron detectors to improve navigation and provide elemental analysis of specimens at high speed and high spatial resolution.

BACKGROUND TO THE INVENTION

With reference to FIG. 1, for X-ray analysis in an electron microscope (EM) 100, an X-ray spectrum is measured by sensing and measuring the energies of individual X-ray photons emitted by a specimen 101 when it is hit by a focussed electron beam 102. (Note that in this document, the convention is that the electron beam travels vertically downwards towards the specimen and this is the context for words such as "below" and "above". In practice the electron beam can be oriented in any direction, including vertically upwards.) Each X-ray photon is an energetic particle and the energy is typically converted into charge using a solid-state detector 105. The charge is measured so that a count can be recorded; the histogram of recorded measurements represents the digitised X-ray energy spectrum. Peaks characteristic of chemical elements can be identified in the X-ray energy spectrum and the intensity of those peaks used as the basis for determining elemental content of the material that is directly under the electron beam 102.

The X-ray detector 105, the final polepiece of the electron microscope 104 and the specimen 101 are usually all within the same vacuum chamber. The vacuum is primarily needed so that the electrons can be accelerated to several keV energy and focussed to a narrow beam without scattering on gas molecules. However, there are alternative configurations where the electron beam may be focussed within a vacuum region while the specimen is in a region of higher pressure. The X-ray detector may be located in the same vacuum region as the electron beam or in a region of higher pressure. Besides the X-ray signal, the signal from electrons backscattered from the specimen (BSE) is also useful for discriminating different materials because the fraction of electrons backscattered from a material increases with the mean atomic number (Z) of the material. Consequently, a backscattered electron detector (BSED) is often positioned above the specimen 101 and below the polepiece 104. A BSED detector 106 typically comprises one or more sensor segments disposed about a central hole through which the focussed beam 102 passes to reach the specimen. This positioning is designed to maximise the collection solid angle subtended by the BSED segments at the point where the focussed beam strikes the specimen, the "probe spot" and thus maximise the BSE signal. An additional detector, typically of the "Everhart-Thornley" type and mounted to one side of the chamber is used to detect secondary electrons that are generated in the specimen and emerge from the surface and thus produces the "SE" signal. The SE signal is usually considerably stronger than the BSE signal and is very sensitive to surface orientation relative to the incident beam.

If the focussed incident beam is rastered or scanned in some other pattern by deflecting the beam magnetically or electrostatically and positioning sequentially over a 2D grid of pixel positions on the specimen surface, the SE or BSE signal at each position can be used to build a digital image that can be displayed on a monitor and gives a magnified view of the specimen. This is well-known principle of operation for the scanning electron microscope (SEM) and the SE image in particular is very useful for navigating around the specimen because it shows the topography of the surface. If there is any topography on the specimen, any tilted surface facets will also produce BSE signals that are dependent on the orientation of the facet and will be stronger in certain directions. The BSE signal is stronger for a region of a sensor that is in the direction of tilt of the facet away from normal to the electron beam and weaker for a sensor that is in the opposite direction. This sensitivity to surface tilt produces "topographic contrast" in the image that interferes with the "atomic number contrast" or "Z contrast" produced by changes in composition of material within the scanned region. In order to minimise the directional effect of topography on the BSE signal, it is imperative that the total sensitive area of the BSE detector is symmetrically disposed with respect to the incident electron beam. Ideally, the sensitive area would be a disk with perfect rotational symmetry about the central hole but there are some benefits to using a multiplicity of independent sensor segments to make up the total sensitive area while maintaining rotational symmetry. The "4-quadrant" arrangement, with 4-fold rotational symmetry, is common as seen for example in the Micron Semiconductor catalogue: http://79.170.44.80/micronsemiconductor.co.uk/wp-content/uploads/2017/03/MSL-OEM-Catalogues.pdf. It is well known that if all segments of a multi-segment BSE detector are used to collect electrons symmetrically about the beam, "atomic number" contrast dominates rather than topographic contrast. See for example Wikipedia entry: https://en.wikipedia.org/wiki/Scanning_electron_microscope #Detection_of_backscattered_electrons.

Thus, the positioning of a BSE detector at 106 just below the polepiece not only provides good collection efficiency for the BSE signal but also enables a signal to be collected that is more representative of mean atomic number of the material rather than local surface tilt. The BSE signal at each pixel position can be used to build an image where each pixel intensity is indicative of material atomic number at that position.

The same position 106 can also be used to maximise the collection solid angle for an annular X-ray detector. However, replacing the BSED with an X-ray detector in position 106 would remove the capability to detect a BSE signal that is insensitive to topography. Soltau et al (Microsc Microanal 15(Suppl 2), 2009, 204 5) suggest a method to overcome this problem by surrounding a ring of sensor segments for BSE with an outer ring of X-ray sensor segments as visualized in FIG. 2.

The BSE detector segments are closest to the central hole and are disposed symmetrically around it while the X-ray detector segments, also symmetrically disposed, are further from the central hole.

While this arrangement puts both BSED and X-ray sensor segments close to the specimen and maintains 4-fold rotational symmetry for the BSED total sensitive area, the collection solid angle for the X-ray sensor segments is compromised by being positioned further away from the central hole in order to accommodate the BSED sensors. Furthermore, if the individual X-ray sensor segments are "silicon drift detector" (SDD) type (see for example https:// en.wikipedia.org/wiki/Silicon_drift_detector), for a given area, the optimum response time is achieved for a circular sensor segment so the elongated shape of the X-ray sensor segments in the arrangement of FIG. 2 is not optimal with regards to response time for a given sensitive area.

The X-ray detector segments will also be sensitive to high energy backscattered electrons and since there are orders of magnitude more BSE than X-rays striking the sensor segments, the BSE signal would normally overwhelm the small X-ray signal and prevent the acquisition of a useful X-ray spectrum. Therefore, a filter material needs to be interposed between specimen and sensor with suitable thickness to prevent transmission of the highest energy BSEs while allowing low energy X-rays to pass through to the sensor. Liebel et al (Microsc. Microanal. 20 (Suppl 3), 2014 1118-9) suggest an arrangement using combined BSE and X-ray sensors as in FIG. 2 with filters in front of the X-ray sensors as shown in FIG. 3.

In a scanning electron microscope, the incident electrons are typically accelerated to an energy of 20 keV and in order to block BSEs up to this energy, a filter such as a 6-micron thick foil of Mylar may be required. The X-ray transmission through such a foil as a function of X-ray photon energy is shown in FIG. 4.

With such a filter in place, the detector will be insensitive to X-rays below about 1 keV in energy so that elements with characteristic line emissions below 1 keV will be difficult to identify in the X-ray spectrum. For example, elements Be, B, C, N, O, F, Ne, Na would be very difficult to detect with such a filter in place.

A further problem with this arrangement is that because the module containing the combined BSE and X-ray sensors has larger diameter than a typical BSE detector, the module may partly obscure the line of sight to the specimen 103 for a detector or any other accessory device that is mounted to one side of the microscope, as shown in FIG. 5.

Examples of accessory devices that could be mounted at side positions like 105 in an electron microscope and need line of sight of the specimen include X-ray detectors, electron detectors, cathodoluminescence detectors, mass spectrometers, micromanipulators, gas injection devices and lasers. An example of a current X-ray detector module that is held below the polepiece is the "Rococo Preamplifier Module" product from PNDetector (https://pndetector.com/ w/wp-content/uploads/2018/08/Rococo_2017.pdf). This module does not have any BSE sensors yet, when in position for analysis, its periphery extends 10.5 mm away from the electron beam axis even when it is oriented to minimise occlusion of a side-mounted accessory.

To maximise the collection solid angle for the segments, they need to be as close to the electron beam axis as possible and this ideally means that the central hole should be as small as possible. However, if the central hole of the module is made too small, this makes it difficult to align the hole to make sure the electron beam passes through unhindered. Furthermore, if, for example, the material around the hole is magnetic or if contamination builds up on the inside surface of the hole and causes electrostatic charge build up, this may interfere with the focussing of the beam or with the deflection of the focussed beam when it is scanned over the region to be imaged on the surface of the specimen. Therefore, the central hole must be big enough to avoid any interference with the focussing or deflection of the incident electron beam that could distort the image.

When a specimen is viewed in the SEM, the area scanned by deflecting the focussed electron beam to obtain material analysis mapping data is typically less than 0.1 mm across. The SEM operator will usually see a magnified image of the scanned region based on the SE signal data obtained while scanning the beam.

However, a typical specimen support stub is at least 10 mm in diameter and it is difficult for the operator to know exactly where the small scanned region is located on the much large specimen support. The walls of the SEM are opaque and when the SEM is operating, the specimen is inside an evacuated region so it is not possible for the operator to use a viewing window to see the full specimen support. A so-called "chamberscope", an infrared-sensitive TV camera with an infrared light source, is commonly mounted to one side of the specimen chamber and used to give the operator an optical image of the inside of the SEM chamber. Although a chamberscope is very useful to determine the position of the specimen stage relative to other detectors and accessories within the chamber, it does not give a view of the specimen surface at an orientation and magnification suitable to help the operator locate the area scanned by the electron beam relative to the surrounding specimen surface.

What is needed is a solution to help the operator navigate to regions of interest on the specimen that provides large solid angle for both BSE and X-ray detection, does not interfere with the electron optics, gives good material atomic number contrast for the BSE image while minimising topographic contrast, avoids obscuring line of sight for an accessory device mounted at one side of the electron beam, has fast response time and ability to discriminate materials of different composition.

SUMMARY OF THE INVENTION

In accordance with a first aspect of the invention there is provided a detector module for use in an apparatus for analysing a specimen, the detector module comprising a plurality of X-ray sensor elements and one or more electron sensor elements, wherein the detector module is adapted to be positioned below a polepiece of an electron beam assembly of the apparatus from which the electron beam generated by the assembly emerges towards a specimen in use, such that the detector module receives X-rays and backscattered electrons generated by interaction between the electron beam and the specimen, and wherein each of the plurality of X-ray sensor elements is configured to monitor energies of individual received X-ray photons, and wherein the plurality of X-ray sensor elements have a total active area greater than 20 mm$^2$, and the radial extent of the detector module with respect to the electron beam axis is less than 10 mm for at least a first portion of the detector module.

It has been found that employing a detector module having this configuration and including sensor elements arranged in this way can provide significant improvements to navigation and analysis of specimens in an electron beam instrument. This is achieved by the above described arrangement allowing a large total solid angle of collection for both X-ray and backscattered electron (BSE) detectors to be maintained, while ensuring that the module comprising those detectors does not occlude a line of sight to the spot at which the electron beam strikes the specimen (the "probe spot") for any accessory devices that might be positioned to one side of the electron beam assembly.

The term "module" as used in this disclosure is intended to refer to a device, in particular one that is adapted for use with an apparatus, typically an electron beam instrument such as an electron microscope. The term "module" may therefore be used interchangeably with the term "device" in the context of this disclosure. Preferably the module is provided as a self-contained set of components suitable for being equipped in such an instrument. The module is preferably removably mountable within an apparatus or adapted to be removably equipped to a support or mounting structure or mechanism therein. The term "detector module" may be understood as a reference to the device or set of components being adapted for the purpose of detecting particles, in particular by way of sensor elements, in an electron beam apparatus.

It will be understood that, in the context of this disclosure, the electron beam assembly may be thought of as being configured to generate the focussed electron beam, and that the detector module may be described as a module for detection of particles. The expression "particles" is used in this disclosure to refer to both electrons and X-ray photons.

Typically each of the X-ray sensor elements is configured to detect, be sensitive to, or output a signal in response to, incident X-rays. Likewise, each of the electron sensor elements is typically configured to be similarly responsive to incident electrons (preferably backscattered electrons).

The module being adapted to be positioned below a polepiece of an electron assembly of an analysis apparatus may be understood as the module being suitable for being disposed in such a position in use. In other words, the module typically has a size, shape, and sensor element configuration that permits the sensors to receive X-rays and electrons generated by a specimen in the apparatus in use. Typically therefore the module is adapted to operate while positioned between the polepiece and the specimen, and in particular more proximal to the former than the latter. The module is typically also shaped so as to permit passage of the electron beam from the polepiece to the specimen in use. In preferred embodiments this configuration involves the shape of the module defining a space through which the electron beam can pass unimpeded. Typically the module is shaped so as to surround, partly or entirely, that space, and thereby the electron beam in use also. In typical embodiments, the detector module being positioned below the polepiece may be understood as the module being in a position below the polepiece so as to allow the electron beam to pass through to the specimen. This arrangement may be effected even in embodiments wherein the sensor elements are positioned with at least two-fold rotational symmetry about the axis of the beam, as is disclosed in more detail below. Typically, in embodiments wherein, in use, a space is defined between the polepiece and the detector module, that space is as small as is practical with the mechanical arrangement to hold the module. The term "below" as used in this context typically refers to being further along the direction of travel of electrons in the electron beam in use. The term does not necessarily refer to being further down in a vertical direction, or to any particular orientation with respect to gravity.

Typically, the electron beam assembly takes the form of an electron beam column. The polepiece below which the detector module is mounted or mountable is typically the final lens polepiece. This may be understood as the pole-piece of the final lens of the electron beam assembly or column through which the electron beam passes before striking the specimen.

It will be understood that each of the plurality of X-ray sensor elements can be used to monitor X-ray photon energies as noted above. The sensors may be adapted to measure, or otherwise provide or output a signal or data representative of the detection or energies of received X-ray photons. In this way, the said sensor elements may be configured both to detect individual received X-ray photons and to monitor energies of individual received X-ray photons. The total active area of the plurality of X-ray sensor elements may be thought of as that of all of the X-ray sensor elements of the plurality in combination. The active area will be understood, typically, as the surface area of the sensor for which the sensor element is responsive or sensitive to particles incident on that surface or part thereof. In preferred embodiments the plurality of X-ray sensor elements have a total active area greater than 30 mm$^2$, more preferably greater than 40 mm$^2$.

The radial extent of the detector module may be thought of, for example, as the extent of the module in a direction perpendicular to the electron beam axis. The radial extent of the module in the first portion with respect to the electron beam axis, and generally any configuration or geometry defined in terms of the electron beam axis, may be understood as being defined with respect to the position and/or orientation of the electron beam while the module is mounted or otherwise disposed in an operating position or location within the apparatus within which the beam is being directed upon the specimen in use. Typically, the module and/or an analysis apparatus such as an electron microscope, is configured such that the module is mountable in a predetermined orientation and position with respect to the apparatus, or at least with respect to the specimen and/or the final polepiece of the electron assembly. As alluded to above, this predetermined relative arrangement of the module and an apparatus within which it is used to detect X-rays and electrons from a specimen is preferably one in which the module is mounted below the polepiece so as to receive the said particles. It is therefore typically the position and orientation of the electron beam axis when the module is mounted within the apparatus for analysis in respect of which the aforementioned radial extent for the first portion is defined. It will be understood that the said radial extent typically defines the extent to which the module obscures lines of sight from the part of the specimen that is struck by the beam in use to positions in which further detectors or accessory devices might be equipped around the electron beam assembly. Providing a first portion of the detector module in which the extent is less than 10 mm advantageously ensures that some lines of sight are preserved and unobscured by the module.

Alternatively or additionally to the above described feature of the first portion of the detector module and its radial extent, and the total active area of the plurality of X-ray sensor elements, the total active area of all X-ray sensor elements may exceed 30 mm$^2$ and the minimum radial distance from the electron beam axis to the outstanding perimeter of the module on the side facing the specimen may be less than 10 mm. Applying such a limitation to the extent of the module at the side of the module that faces the specimen specifically is that, in typical embodiments, it is the side, or major face, of the detector module that is proximal to the specimen that defines the degree to which the detector module obscures the probe spot from accessory devices arranged there above.

The electron beam axis may be thought of as an axis that is collinear with the electron beam, or typically coincident with at least two centroids of the electron beam that are spaced apart along the path of the beam.

The aforementioned first portion of the detector module may typically be defined as a part of the module within which the radial extent of the module is less than a predetermined radial extent value. The required maximum value of 10 mm for the radial extent in this portion provides a module form or outline that advantageously permits unrestricted visibility or access to the probe spot. As detailed below, in some embodiments the minimum radial extent of the module within the first portion may be less than this predetermined value for at least some of, typically a central part of, the first portion.

The first portion may also be defined as a part of the module that is between first and second planes, the intersection of which is collinear with the electron beam axis in use. The portion, and in particular the size thereof, may be defined by its angular or circumferential extent, for example, an angle between those first and second planes, or between the respective normal vectors thereof, or the length of the outer perimeter or peripheral edge or surface (i.e. that distal to the beam) of the first portion of the detector module. The angular or circumferential extent of the first portion that may be required, in some embodiments, to avoid occlusion of lines of sight to accessory devices may be configured in dependence on the type of accessory device with which the module is intended to be used in an electron beam instrument. That is to say, some accessory devices may require only a small "cut-out" in which unobscured lines of sight to the probe spot are provided. In such cases the "width" or angular extent, of the first portion may be minimal. On the other hand, some devices may benefit from wider portions in which the radial extent of the module is smaller than that outside the portion. In some embodiments, this angular extent of the portion within which the radial extent of the module is less than the required maximum radial extent value within the portion, namely 10 mm, is infinitesimal. It will be understood this value is typically a local maximum, in that it represents a "maximum" value only for the first portion, whereas in most embodiments this portion forms a part of the module having a smaller radial extent than other parts of the module. The first portion having an infinitesimal angular extent may be understood as the first and second planes being coplanar or substantially so.

In such arrangements the first portion may accordingly correspond to a radial minimum either side of which the radial extent increases. The geometry of the module may be such that this increase is according to some continuous function, whereby the outer perimeter of the module may have a straight or curved section within which this minimum lies. Examples of such geometries are provided later in this disclosure. In other embodiments, the portion may be bounded on one or either side by a sharp or discontinuous perimeter shape beyond which the radial extent of the module is greater, for example defining a slot-shaped gap. In these various embodiments, the predetermined maximum radial extent value may preferably be 7 mm, or more preferably 5 mm. In some embodiments, on one or both (circumferential) sides of the first portion, a further portion may be defined in which the radial extent of the module does not exceed a second radial value, greater than the radial extent value for the first portion and less than a maximum and/or an average radial extent value for the entire circumference or perimeter of the module.

In addition to the first portion, the detector module may further comprise a second portion in which the radial extent of the detector module is similarly minimised, and in particular is likewise less than 10 mm.

In some embodiments, the detector module comprising an outer edge, typically between an outer surface of the detector module and a surface of the detector module that faces the specimen in use. In such embodiments, the minimum radial distance between the electron beam axis and the outer edge is preferably less than 10 mm.

In some preferred embodiments, the radial extent of the first portion of the detector module, or the minimum radial distance from the electron beam axis to the outside perimeter of the module on the side facing the specimen, preferably, is less than 7 mm. More preferably this is less than 5 mm.

Typically, at least half, and preferably more than half, of the total active area of the plurality of X-ray sensor elements is less than 6 mm from the electron beam axis, in use. It is beneficial to provide a determined proportion of the active X-ray sensor area within a predetermined radius with respect to the beam axis. More preferably, the radial distance from the electron beam axis within the predetermined proportion of the active area, which may be half or more than half as noted above, may be less than 6 mm, preferably less than 5 mm, more preferably less than 3 mm.

In addition to the above described minimum total active area for the X-ray sensor elements, in preferred embodiments, the one or more electron sensor elements have a total active area greater than 30 mm$^2$. In preferred embodiments, the module comprises a plurality of electron sensor elements. However, it will be understood that sensor arrangements may be provided in which two or more electron sensor elements are connected together by a connecting sensor portion, or in which they are fabricated as a single sensor element.

It has been found that it is beneficial to arrange the sensor elements in the detector module such that the X-ray sensors have limited rotational symmetry, while the electron sensor elements have the same or a greater degree of rotational symmetry. Thus preferably the X-ray sensor elements are disposed with no more than two-fold rotational symmetry about the electron beam axis, and the electron sensor elements are disposed with at least two-fold rotational symmetry about the electron beam axis. This symmetry is typically defined in terms of the orientation and position of the electron beam axis relative to the module in use, that is when the module is mounted within an analysis apparatus. It will be understood that these requirements refer to the appearance of the plurality of X-ray sensor elements being identical in no more than two distinct orientations about the beam axis, and the appearance of the plurality of electron sensor elements is identical in two or more distinct orientations about the beam axis.

In some embodiments the performance of the detector module may be enhanced by way of some of the active area of the electron sensor elements being positioned further from the electron beam axis than the most distant part of the X-ray sensor elements to the electron beam axis, with some of the active area of the electron sensor elements being positioned closer to the electron beam axis than the most proximal part of the X-ray sensor elements to the electron beam axis. Therefore, in such preferred embodiments, a radial distance from the electron beam axis to a first location within the active area of the plurality of electron sensor elements is greater than the maximum radial extent with respect to the electron beam axis of the active area of the plurality of X-ray sensor elements, and a radial distance from the electron beam axis to a second location within the active area of the plurality of electron sensor elements is less than the minimum radial distance between the electron beam axis and the active area of the plurality of X-ray sensor elements. Similarly to the previously disclosed symmetry, these radial distances are typically defined in terms of the orientation and position of the electron beam axis relative to the module in use, that is when the module is mounted within an analysis apparatus.

In such embodiments, preferably the detector module is configured to amplify the signal from a first portion of the active area of the plurality of electron sensor elements that is positioned furthest from the electron beam axis before that signal is added to the signal from a second portion of the active area of the plurality of electron sensor elements, which may be thought of as other electron sensor elements, different from the first portion. The portion being furthest from the beam axis may refer to it being located at a radial distance from the beam axis at least as great as the maximum radial extent of the X-ray sensor element area.

As illustrated in the examples provided later in this disclosure, the detector module is typically shaped so that it can at least partially surround the focused electron beam in use, preferably by way of a gap, or more preferably an aperture, in the module through which the beam can pass unimpeded. As is explained in greater detail later in this disclosure, arranging this gap or aperture to have smaller diameters may result in greater degrees of unwanted contamination on the detector module through use. A minimum size for this gap or aperture may therefore be advantageously applied. The values are preferably chosen so as to be sufficiently small to avoid the unwanted reduction of solid angles to the detector areas subtended at the probe spot. Preferably, the internal diameter of an aperture comprised by the detector module, the aperture being arranged such that, in use, the electron beam passes there through, is greater than 1.0 mm, or preferably greater than 1.5 mm, or more preferably greater than 2.5 mm. In some embodiments, the gap or aperture is non-circular, and in such cases, the internal diameter referred to above may be defined as a minimum diameter of the aperture. Typically the aperture or hole is centred on a centroid of the detector module, or a major face thereof. The beam passing through the aperture in the detector module may be understood as the beam passing from one side of the module to the other.

When an accessory device is included, in embodiments such as this, the accessory device may comprise, or may be, any one or more of: an X-ray sensor, a backscattered electron sensor, a cathodoluminescence sensor, a micromanipulator, a gas injection device, a laser, and an X-ray sensor comprising or fitted with an electron trap.

The examples described in this disclosure can advantageously include filter material coverings provided to prevent backscattered electrons from deleteriously affecting the X-ray sensors in use. Preferably, therefore, the detector module further comprises at least one material layer disposed on at least a portion of, or all of, the active area of the plurality of X-ray sensor elements. The at least one material layer may be adapted to block, partially or completely, transmission of any one of more of electrons, visible light, and infra-red radiation while allowing partial or complete transmission of X-rays having energies within a first range of energies, or a first energy band. This band may correspond to a range of X-ray photon energies identified or determined as being useful for analysis. Typically, the layer material and/or its thickness is configured to have the requisite X-ray transparency, and requisite opacity to unwanted radiation or particles. The first range may correspond to energies of X-rays that are useful for elemental analysis. This may be a predetermined range of energies. The numerical limits of this range might not necessarily be known. However, preferably the layer or layers are configured to permit at least X-rays in a desired energy band or sub-band thereof.

In other words, in some embodiments, the X-ray sensors in the module may be covered by one or more layers of material to block the transmission of electrons or visible light or infra-red radiation to each sensor while still transmitting X-rays with energies useful for analysis.

In some embodiments, the material layer, or at least one of the material layers in those embodiments that comprise multiple layers, has the form of a coating applied to a surface of the said portion of the active area of the plurality of X-ray sensor elements. The surface may be thought of as an upper surface, that is a surface configured to receive X-rays for the detection and monitoring of X-ray photons and their energies. In various embodiments, one or more of the material layers may alternatively or additionally be provided as a self-supporting film or sheet.

A coating applied to a sensor element surface may be provided to prevent light or some electrons reaching the sensor. However, in some such embodiments, the one or more material layers further may comprise a separate filter material in front of the sensor to block more electrons. If that filter material is an electrical insulator, it is beneficial to provide an additional conductive coating that is effectively grounded to prevent this insulating layer from charging owing to incident electrons. The material layer, or at least one of the layers in embodiments wherein multiple layers are provided, for example in a stack, is preferably electrically grounded. Preferably it is also electrically conductive so as to prevent the electric potential of the material layer, layers, or stack, increasing owing to electrostatic charging attributable to incident electrons, that is electrons that irradiate or impinge upon the layer. The aforementioned conductivity of the layer typically refers to the material having sufficient conductivity and the layers having sufficient conductance to permit electrical charge to dissipate and prevent the electric static charge accumulation in the layer.

The detector module may, in some embodiments, further comprise a cooling controller configured to maintain the plurality of electron sensor elements within a predetermined range of temperatures in use. The controller may be configured to maintain the plurality of electron sensor elements at a predetermined temperature, more preferably. Maintain of the temperature of these elements within a desired duration of temperatures may be advantageous for certain manners of operation of the analysis equipment.

Typically in such embodiments, the cooling controller is configurable so as to maintain the plurality of electron sensor elements within a selected one of a plurality of predetermined temperature ranges, each of which may alternatively be a predetermined temperature value rather than a finite range. Each of the aforementioned ranges or values may correspond to an optimum operating temperature range or value for a respective operating mode of the electron beam assembly. Preferably, they may correspond to respective modes of an electron microscope comprising the apparatus or detector module.

Thus the temperature of the sensors can, in some embodiments, be configured to optimise performance to suit different operating modes of the electron microscope.

Each of the plurality of X-ray sensor elements may, in some embodiments, be arranged behind, or be aligned with, an aperture in a conductive plate configured to function as a first electrode of a capacitive sensor adapted to monitor the proximity of the specimen and/or specimen holder. Such plates are so configured typically by monitoring capacitance between the plate and the specimen or holder so as to derive information representative of separation or distance therebetween, or a rate of change thereof. In these arrangements, typically the aperture is provided such that X-rays generated in the specimen by interaction with the electron beam can pass through the aperture and be received by the sensor element.

Typically, the detector module further comprises an optical camera arranged to have a field of view of the specimen at least 10 mm across the specimen surface, with a camera-to-specimen distance of less than 10 mm and, optionally, a depth of field of the camera may be sufficient to allow the width of the field of view to be increased to at least 20 mm, or preferably more than 60 mm, by increasing the camera-to-specimen distance. The optical camera may be understood as, for example, an image sensor configured to operate in or employ the visible part of the electromagnetic spectrum.

In some embodiments, the detector module may be further configured for performing a method of displaying the location of the region being analysed under the electron beam within an optical image of the specimen to be examined wherein the surface of a cathodoluminescent specimen is positioned at a specific working distance from the final lens polepiece of the electron microscope, a digitised optical image is obtained with source of illumination switched off while the focussed electron beam is incident on the specimen, the position coordinates within the optical image of the centre of the spot of light emitted by cathodoluminescence are determined, the surface of the specimen to be examined is positioned at the same specific working distance as the cathodoluminescent specimen and a digitised optical image is obtained with a light source illuminating the specimen, the optical image of the specimen to be examined is shown on a visual display where the location of the electron beam analysis region is highlighted centred on the position coordinates obtained from the optical image obtained from the cathodoluminescent specimen.

In other embodiments, the detector module may be configured for performing a method of displaying the location of the region being analysed under the electron beam within an optical image of the specimen to be examined, wherein the surface of a small recognisable feature is focussed at a specific working distance from the final lens polepiece of the electron microscope and an electron image acquired with the feature at the centre of the field of view, a digitised optical image is obtained with source of illumination switched on and the position coordinates of the centre of the same recognisable feature within the image are determined, the surface of the specimen to be examined is positioned at the same specific working distance as used to image the small recognisable feature and a digitised optical image is obtained with a light source illuminating the specimen, the optical image of the specimen to be examined is shown on a visual display where the location of the electron beam analysis region is highlighted and centred on the position coordinates of the recognisable feature.

In any of these embodiments, the detector module may comprise a first optical camera, which may be the same as or different from that described above, and a second optical camera having respective first and second fields of view of the specimen that at least partially overlap. The first and second optical cameras may be arranged such that first and second images captured respectively thereby can be used to provide a stereoscopic display of the specimen, and/or such that data from or output by the cameras can be used to generate a topographic map of the specimen surface.

The detector module may, in some embodiments, be configured for performing, or configured to perform a method of acquiring and processing data wherein: spectral data from an accessory X-ray detector, spectral data from the plurality of X-ray sensor elements, and, optionally, data from the plurality of electron sensor elements, are recorded as the electron beam is positioned at a series of points covering a region on the specimen: spectral data from the module and, optionally, data from the plurality of electron sensor elements and/or spectral data from an accessory X-ray detector, are used to identify sub-regions where the recorded signals are similar for points within a given sub-region; spectral data from an accessory X-ray detector, preferably the said accessory X-ray detector, for a set of positions, preferably all positions, within a sub-region are combined to produce a single spectrum representative of the material within that sub-region; the representative spectrum for a sub-region is processed to determine the intensity values for one or more characteristic elemental X-ray emissions and, optionally, the concentrations of the corresponding elements responsible for those emissions; image data are assembled for one or more elements by assigning the value of intensity or concentration for an element derived from the sub-region representative spectrum to image points, preferably every image point, within a sub-region; the assembled image data for an element for identified sub-regions is used to provide a visual representation of element distribution over the region of the specimen.

Typically in such embodiments, the data from the X-ray sensors in the module at each point are scaled by a factor inversely proportional to the sum of the electron sensor data at that point.

The data for points within an identified sub-region are typically inspected before the spectral data from an accessory X-ray detector are combined in order to exclude points from the sub-region for which the point data is outside the expected range of variation of the data for points in the sub-region.

The spectral data from an accessory X-ray detector for points within an identified sub-region may be aggregated to produce a single spectrum for the sub-region by using a weighted combination of spectra where the weight for a spectrum depends on a measure of the difference between that spectrum and the average spectrum for the whole sub-region.

The detector module may be configured to perform, or configured for performing, a method of acquiring and processing data, wherein spectral data from an accessory X-ray detector, spectral data from the X-ray sensors in the module and optionally data from the electron sensors in the module are recorded as the electron beam is positioned at a series of points covering a region of the specimen; spectral data from the module and optionally data from the electron sensors in the module and optionally spectral data from an accessory X-ray detector are used to identify sub-regions where the recorded signals are similar for points within a given sub-region; for sub-regions, preferably every sub-region, spectral data from an accessory X-ray detector for each point within a sub-region are combined by weighted averaging with data from other points, preferably all other points, in the sub-region to produce a denoised version of the spectrum at that point; the denoised spectrum for each point is processed to determine the intensity values for one or more characteristic elemental X ray emissions and optionally, the concentrations of the corresponding elements responsible for those emissions; image data are assembled for one or more elements by assigning the value of intensity or concentration for an element derived from the denoised spectrum to image points, preferably every image point; the assembled image data for an element is used to provide a visual representation of element distribution over the region of the specimen.

In such embodiments, preferably the weighted averaging for the denoised spectrum at a point uses weighting factors for each other point in the sub-region that depend on a measure of the difference between the spectrum data or module vector data for that point and the corresponding spectrum data or module vector data for each other point in the sub-region.

The data from the plurality of X-ray sensor elements comprised by the detector module at each point may preferably be scaled by a factor inversely proportional to the sum of the electron sensor data values at that point. The data for points within an identified sub-region may be inspected in order to exclude points from the sub-region for which the point data is outside the expected range of variation for the points in the sub-region.

In accordance with a second aspect of the invention there is provided an apparatus for analysing a specimen, the apparatus comprising: an electron beam assembly for generating a focused electron beam; and a detector module according to the first aspect.

In some embodiments, the detector module can be oriented such that the minimum radial distance from the electron beam axis to the outside perimeter of the module on the side facing the specimen is in the direction of an accessory device mounted to one side of the electron beam assembly. Therefore, in such embodiments typically the apparatus further comprises an accessory device mounted to the electron beam assembly, wherein the orientation, particularly about the electron beam axis, of the detector module with respect to the electron beam assembly and/or the accessory device is such that at least a part, preferably a central part, more preferably one that is annularly/circumferentially central so as to be equidistant or substantially so from the two planes defining the first portion, of the first portion of the detector module and at least a part of the accessory device, preferably a central part thereof or a part coinciding with the centre of a sensor or operative component of the accessory device, coincide with a plane within which the electron beam axis lies. The plane within which the axis lies may be thought of as a third plane, with reference to the aforementioned first and second planes which, as described above, may define or enclose the first portion of the module. This arrangement may advantageously mean that the minimum radial extent of the module is aligned, with the respect to rotation about the electron beam axis, with the device. Thus unobscured lines of sight from the specimen, specifically the probe spot, to an accessory device mounted above the module and close to the electron beam assembly can be provided. Typically the first portion is positioned between the electron beam axis and the accessory device in use, so that the accessory device is oriented to view or access the specimen by way of, or at least in a manner facilitated by, the minimal extent of the module at the first portion.

As described above, the apparatus may include an accessory device. Such accessory devices, or, in some embodiments, a further accessory device, may comprise or be an X-ray detector fitted with an electron trap supported on a mechanical assembly on which the detector module is supported also.

In accordance with a third aspect of the invention there is provided a method of analysing a specimen. The method may preferably be performed using a detector module according to embodiments of the first aspect or an apparatus according to embodiments of the second aspect. Typically the method is performed within an electron beam instrument such as electron microscope. The method comprises: using an electron beam assembly to generate a focused electron beam; and providing a detector module comprising a plurality of X-ray sensor elements and a plurality of electron sensor elements, wherein the detector module is positioned below a polepiece of the electron beam assembly from which the focused electron beam emerges towards the specimen, such that the detector module receives X-rays and backscattered electrons generated by interaction between the electron beam and the specimen, and monitoring, using the plurality of X-ray sensor elements, energies of individual received X-ray photons, wherein the plurality of X-ray sensor elements have a total active area greater than 20 $mm^2$, and the radial extent of the detector module with respect to the electron beam axis is less than 10 mm for at least a first portion of the detector module.

The method may further comprise recording a signal, of signals, for example a respective signal for each point in the region, comprising: spectral data from the plurality of X-ray sensor elements, and, optionally, data from the plurality of electron sensor elements, while causing the electron beam to strike a series of points covering a region of the specimen; identifying, using spectral data obtained by the detector module and, optionally, data from the plurality of electron sensor elements in the module, and, optionally, spectral data from an accessory X-ray detector; sub-regions for which the recorded signals are similar for points within a given sub-region; combining spectral data from an accessory X-ray detector for a number of positions, preferably all positions, within each sub-region so as to produce a single spectrum representative of the material within that sub-region; processing the representative spectrum for each sub-region so as to generate intensity values for one or more characteristic elemental X-ray emissions and, optionally, data representative of concentrations of the corresponding elements associated with the said emissions; assembling image data for one or more elements by assigning the intensity value or concentration data for an element derived from each sub-region representative spectrum to image points, preferably every image point, within a sub-region; and generating, using the assembled image data for an element for the identified sub-regions, a visual representation of element distribution over the region of the specimen. Typically the spectral data is obtained by the X-ray sensor elements of the detector module. The identifying of sub-regions may be thought of as defining a sub-region as a part of the region in which the recorded signals for all or at least a plurality of points are similar. This similarity may be determined in accordance with a requisite similarity threshold, for example comparing signals for pairs or multiple points. The spectral data may be combined for a number of, or wall positions, within at least one of, preferably a plurality, or all of the identified sub-regions. The representative spectrum may be processed for at least one of, and preferably a plurality of or all of the identified sub-regions. The data representative of concentrations of the corresponding elements may be understood as representing concentrations of elements responsible for the said omissions, particularly by way of their presence and interaction with the incident electron beam at the probe spot.

The generating the visual representation may be thought of as providing the said representation, and may take a number of different forms. The assembled image data used for doing so may be that for at least a set of, and preferably all of, the identified sub-regions.

Typically, the data from the X-ray sensors in the module at each point are scaled by a factor inversely proportional to the sum of the electron sensor data at that point. Preferably in such embodiments, the data for points within an identified sub-region are inspected before the spectral data from an accessory X-ray detector are combined in order to exclude points from the sub-region for which the point data is outside the expected range of variation of the data for points in the sub-region. In other embodiments, preferably the spectral data from an accessory X-ray detector for points within an identified sub-region are aggregated to produce a single spectrum for the sub-region by using a weighted combination of spectra where the weight for a spectrum depends on a measure of the difference between that spectrum and the average spectrum for the entire sub-region.

In a method of acquiring and processing data using a detector module according to embodiments of the first aspect or an apparatus according to embodiments of the second aspect, or alternatively in embodiments of the method according to the third aspect, typically, signals comprising: spectral data from an accessory X-ray detector, spectral data from the X-ray sensors in the module and optionally data from the electron sensors in the module, are recorded as the electron beam is positioned at a series of points covering a region of the specimen; spectral data from the module and optionally data from the electron sensors in the module and optionally spectral data from an accessory X-ray detector are used to identify sub-regions where the recorded signals are similar for points within a given sub-region; for sub-regions, preferably every sub-region, spectral data from an accessory X-ray detector for each point within a sub-region are combined by weighted averaging with data from other points, preferably all other points, in the sub-region to produce a denoised version of the spectrum at that point; the denoised spectrum for each point is processed to determine the intensity values for one or more characteristic elemental X ray emissions and optionally, the concentrations of the corresponding elements responsible for those emissions; image data are assembled for one or more elements by assigning the value of intensity or concentration for an element derived from the denoised spectrum to image points, preferably every image point; the assembled image data for an element is used to provide a visual representation of element distribution over the region of the specimen.

Preferably, the weighted averaging for the denoised spectrum at a point uses weighting factors for each other point in the sub-region that depend on a measure of the difference between the spectrum data or module vector data for that point and the corresponding spectrum data or module vector data for each other point in the sub-region. More preferably, the data from the X-ray sensor elements comprised by the module at each point are scaled by a factor inversely proportional to the sum of the electron sensor data values at that point. More preferably still, the data for points within an identified sub-region are inspected in order to exclude points from the sub-region for which the point data is outside the expected range of variation for the points in the sub-region.

A method of displaying the location of the region being analysed under the electron beam with an optical image of the specimen to be examined using a detector module according to embodiments of the first aspect or an apparatus according to embodiments of the second aspect is provided, wherein the surface of a cathodoluminescent specimen is positioned at a specific working distance from the final lens polepiece of the electron microscope, a digitised optical image is obtained with source of illumination switched off while the focussed electron beam is incident on the specimen, the position coordinates within the optical image of the centre of the spot of light emitted by cathodoluminescence are determined, the surface of the specimen to be examined is positioned at the same specific working distance as the cathodoluminescent specimen and a digitised optical image is obtained with a light source illuminating the specimen, the optical image of the specimen to be examined is shown on a visual display where the location of the electron beam analysis region is highlighted centred on the position coordinates obtained from the optical image obtained from the cathodoluminescent specimen.

A method of displaying the location of the region being analysed under the electron beam within an optical image of the specimen to be examined using a detector module according to embodiments of the first aspect or an apparatus according to embodiments of the second aspect is provided, wherein the surface of a small recognisable feature is focussed at a specific working distance from the final lens polepiece of the electron microscope and an electron image acquired with the feature at the centre of the field of view, a digitised optical image is obtained with source of illumination switched on and the position coordinates of the centre of the same recognisable feature within the image are determined, the surface of the specimen to be examined is positioned at the same specific working distance as used to image the small recognisable feature and a digitised optical image is obtained with a light source illuminating the specimen, the optical image of the specimen to be examined is shown on a visual display where the location of the electron beam analysis region is highlighted and centred on the position coordinates of the recognisable feature.

BRIEF DESCRIPTION OF THE DRAWINGS

Examples of the present invention will now be described, with reference to the accompanying drawings in which:

FIG. 1 shows schematically a first arrangement for X-ray analysis in an electron microscope according to the prior art;

FIG. 2 is a plan view of a detector arrangement according to the prior art, showing the layout of central hole for an electron beam surrounded by a ring of backscattered electron sensor segments and an outer ring of X-ray sensor segments;

FIG. 3 is a schematic cross section of a combined backscattered electron and X-ray detector arrangement;

FIG. 13 is a data table showing a summed response for all BSE sensors relative to central position for different positions of the focussed incident beam on a 1.5 mm×1.5 mm grid on the specimen when it is positioned 5.8 mm from the plane of the BSE sensors of the fourth example module;

FIG. 14 is a data table showing a response for [BSE sensors (1+2)+3.3×sensors (3+4)] relative to a central position for different positions of the focussed incident beam on a 1.5 mm×1.5 mm grid on the specimen when it is positioned 5.8 mm from the plane of the BSE sensors of the fourth example module;

DESCRIPTION OF EMBODIMENTS

Example apparatuses employing the advantageous approach described above use a module that contains both BSE and X-ray detector sensors and is positioned beneath the polepiece for the final lens (i.e. in position 106 of FIG. 5) with the active surface of the sensors facing the "probe spot" where the electron beam strikes the specimen. The module is designed to provide a high total collection solid angle for X-rays emitted from the specimen for the X-ray detector sensors and to maintain rotational symmetry for the arrangement of BSE sensors. The module may be cooled to reduce electronic noise from the sensors or may be at ambient temperature. If electronic cooling is used, such as by thermoelectric/Peltier cooling, then the temperature can be sensed and regulated by feedback and this has a benefit for maintaining constant gain and offset in the BSE detector sensors. As alluded to above, a key aspect of these examples is to maintain a high total solid angle of collection for both X-ray and BSE detectors while ensuring that the module does not occlude line of sight to the probe spot for an accessory device positioned to one side of the electron beam. With conventional SEM designs, and with the module positioned close to the polepiece, it has been found that the lower edge of the module (on the side facing the specimen) should not project more than 10 mm away from the electron beam axis, preferably keep within a radial distance of 7 mm and ideally keep within 4.5 mm radial distance in order to avoid occlusion of typical accessory devices, such as X-ray detectors, that are mounted on the side of SEMs. Reducing the radial occlusion by reducing the overall dimensions involves a compromise in sensitivity. For example, if known module designs such as shown in FIGS. 2 and 3 are reduced in size so that the outside diameter of the module is 9 mm (radial distance to the periphery 4.5 mm), the total area of the four X-ray sensors would be approximately 30 mm$^2$ and the total area of the four BSE sensors less than 8 mm$^2$. Example apparatus according to the present disclosure preferably enable a total area of X-ray sensors significantly greater than 30 mm$^2$ and a total area of BSE sensors significantly greater than 30 mm$^2$ without occlusion of typical accessory devices. It has been recognised that it is advantageous that the module can be rotated and fixed in any angular orientation in order to reduce the radial distance to the outside of the module in the radial direction towards the accessory device. Thus, if a rectangular module with sensor arrangement as shown in FIG. 6 can be rotated about the central beam axis, it can be positioned so that the periphery is only 7 mm radial distance from the beam axis in order to minimise occlusion of a side mounted accessory device while still offering high solid angle for X-ray signal collection.

Figure 6:
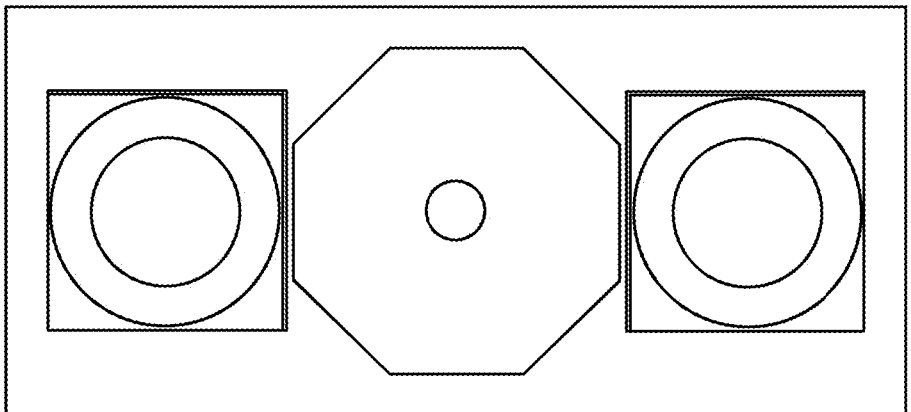
FIG. 6 is a plan view of a first example detector module arrangement according to the invention, comprising two circular X-ray sensors either side of a BSE sensor surrounding a central hole.

Although the BSE sensor in FIG. 6 is shown schematically as an octagon with a central hole, it could be circular or could consist of a set of four segments as in the prior art arrangement of FIG. 2 for example. This would achieve a high order of rotational symmetry of the active area to minimise the effect of topography on the total BSE signal as explained above. Irrespective of whether single or multiple segments are used, provided these segments cover most of the area then the total active area will approximate a disk with a hole (or "annulus") and perfect rotational symmetry about the electron beam axis.

Figure 7:
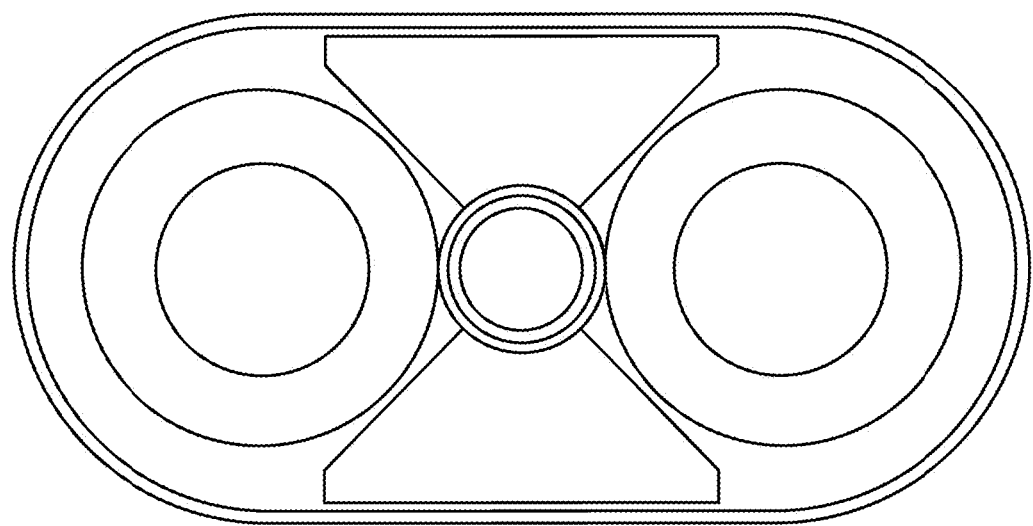
FIG. 7 is a plan view of a second example detector module arrangement according to the invention comprising two circular X-ray sensors either side of a central hole with two BSE segments either side of the hole in a perpendicular direction.

In the example arrangement of FIG. 6, the X-ray sensors are positioned further away from the beam axis than the BSE sensor which compromises the solid angle of the X-ray detectors. The inventors have discovered that, contrary to previous practice, effects of topography on the BSE signal can still be dramatically reduced if the detector has only two segments that do not cover a full annulus, provided the segments show two-fold rotational symmetry. In the arrangement of FIG. 7, this property has been exploited to position two X-ray sensors closer to the electron beam axis for increased collection solid angle while maintaining two-fold rotational symmetry for the BSE sensor segments. As with the arrangement of FIG. 6, if the oval example module of FIG. 7 can be rotated about the central beam axis, it can be positioned to minimise occlusion of a side mounted accessory device by reducing the radial distance to the outer perimeter of the module in a direction towards the accessory mounted device to 6 mm.

While the arrangement of FIG. 7 improves the collection solid angle for X-rays, it compromises the total active area and solid angle for collection of BSE signal. In the example module arrangement shown in FIG. 8, the BSE segments have been enlarged while still maintaining two-fold rotational symmetry. The external boundary of the approximately oval module is shaped to provide two regions where the radial distance from beam axis to the outer periphery is reduced to reduce occlusion of a side-mounted accessory device in either direction. With the arrangement of FIG. 8, the module, the length of which is 21.2 mm, can accommodate two SDD sensors to give a total active area of 40 mm$^2$ or greater with a minimum radial distance from the beam axis to the outer periphery of less than 4.5 mm.

The central hole in the module is needed in this example to allow the focussed electron beam to travel towards the specimen. After prolonged use in the electron microscope, contamination material can build up on the aperture and electronic charge may accumulate on the material. If the edge of the hole is too close to the focussed electron beam it may distort the beam profile and cause a deterioration in microscope image quality. If the module support arm is inserted from a side port on the electron microscope, the hole must be carefully aligned with the electron beam axis to maximise the distance of the focussed beam from the side walls of the hole. The smaller the hole, the more difficult it is to align. Furthermore, a small fraction of electrons in the incident beam may fall outside the main focussed beam and constitute a "beam tail" of intensity that extends well beyond the main beam. If some of this beam tail falls on the side of the aperture, it may exacerbate contamination build up. Therefore, it is beneficial to have as large a central hole as possible to minimise these potential problems. However, if the X-ray and BSE sensor elements are moved further away from the axis to accommodate a larger central hole, this reduces the solid angles subtended at the specimen, so a compromise is involved. We have determined that the internal diameter of the central hole should be at least 1.5 mm and ideally more than 2.5 mm to avoid these effects in most SEMs.

Figure 9:
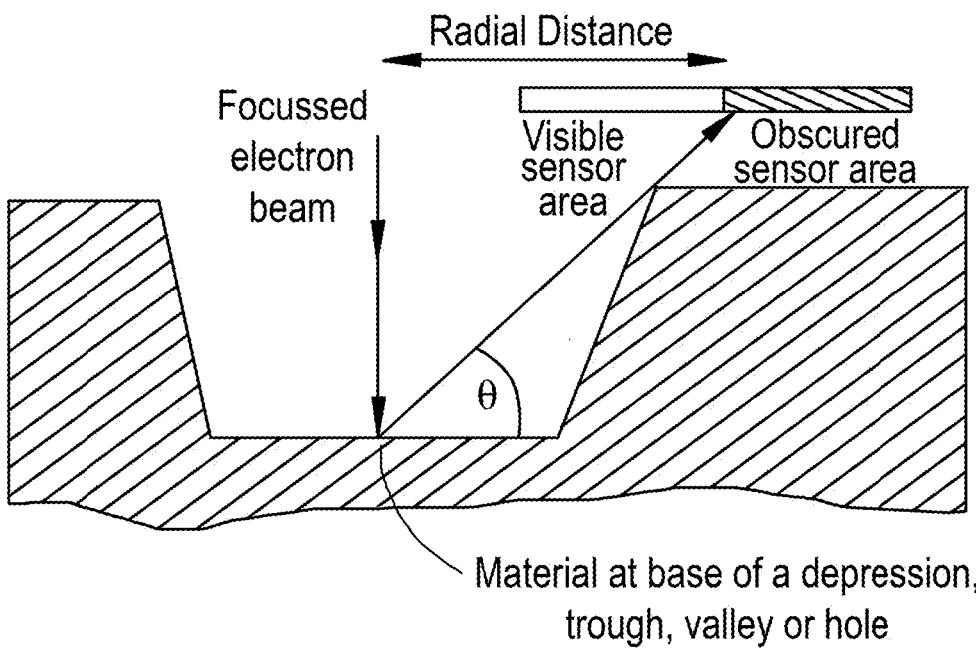
FIG. 9 is a side view of part of a specimen depicting emissions from the base of a depression therein being received at part of a sensor.

An additional advantage of having X-ray sensors below the pole-piece is that they can detect X-rays that are emitted from material that is not visible to a side-mounted accessory detector. FIG. 9 shows a side view of a specimen where the focussed electron beam is striking material at the base of a depression. X-rays emitted from the probe spot can reach any part of the active sensor area that is visible and not obscured by the side wall of the depression. Therefore, it is desirable to have as much active area of a sensor as possible within a small radial distance from the electron beam axis. If the surface of the sensor is at a distance 6 mm from the probe spot on the specimen then X-rays emitted at an elevation θ of 45° with respect to the horizontal would strike the sensor at radial distance 6 mm from the axis. It is desirable to have at least half the total active area of the X-ray sensors within 6 mm of the axis to provide some analysis capability for material at the base of depressions.

As explained above, the at-least 2-fold rotational symmetry about the focussed beam axis for the arrangement of the BSE sensors is important to reduce the effects of topography on the total BSE signal so that it is more representative of material composition rather than the local orientation of the surface. It is also beneficial for the X-ray sensors to be symmetrically disposed about the focussed beam axis, particularly when viewing specimens with high surface topography. If the incident electron beam is striking an object at the base of a "cliff" the cliff itself may obstruct the passage of X-rays to one of the X-ray sensors. However, if the other X-ray sensor is diametrically opposite, it may still have a clear view of the object so that X-ray emissions from the object can be detected. Furthermore, for specimens where the local surface is flat and both X-ray sensors have a clear view of the probe spot, the emitted X-rays will be subject to so-called "matrix" effects, such as specimen self-absorption, that depend on the surface orientation. If the surface is tilted from the horizontal, and the X-ray sensors have 2-fold rotational symmetry about the focussed electron beam axis, then averaging the signals from the two sensors will reduce the influence of surface tilt on the matrix effects.

Although the 2-fold rotational symmetry of the sensors is helpful to reduce topography effects, the overall response of the sensors to excited signals will change when the incident electron beam is deflected to different positions on the specimen surface. This is explained in FIG. 10, which shows a side view of the microscope and two sensors equally disposed about the central axis. When the focussed electron beam is deflected to an off-axis position on the specimen, the collection solid angle for electrons or X-rays is larger for the sensor that is closer to the beam position on the specimen. For positions along a line between both sensors projected on to the specimen surface, the increase in collection solid angle for one sensor is approximately compensated by the reduction in solid angle for the opposite sensor. However, for beam positions in a perpendicular direction to this line, as the distance from the central axis increases, the collection solid angle falls for both sensors.

Figures 10, 11:
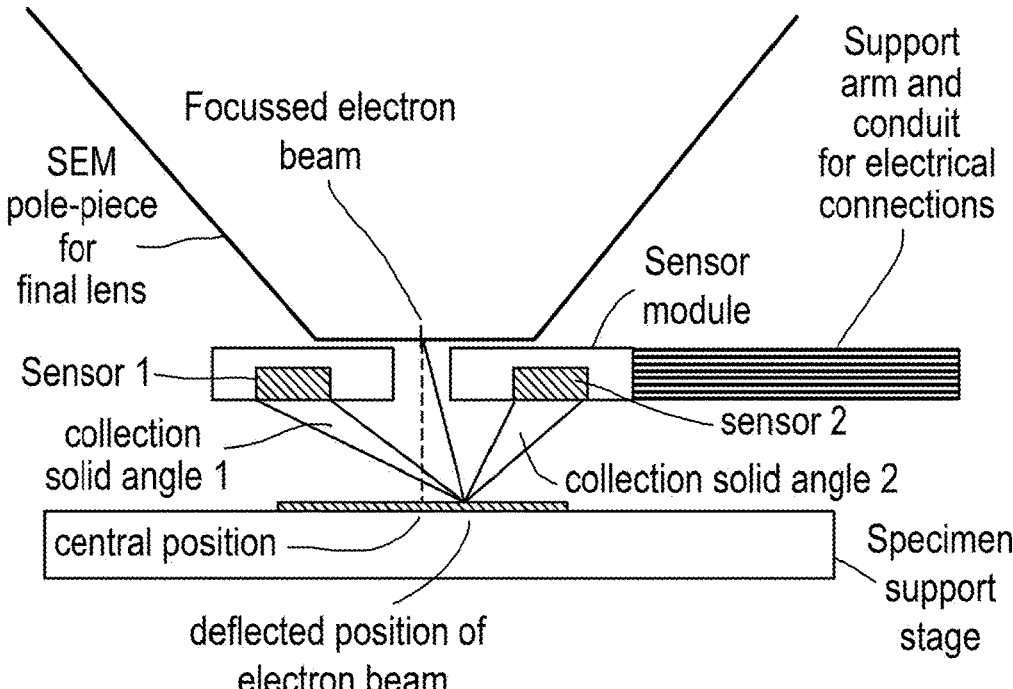
FIG. 10 is a schematic cross section of part of an example apparatus according to the invention, showing how the collection solid angle for different sensors changes when the focussed electron beam is deflected away from the central position.
FIG. 11 is a data table showing a summed response for both BSE sensors relative to central position for different positions of the focussed incident beam on a 1.5 mm×1.5 mm grid on the specimen when it is positioned 5.8 mm from the plane of the BSE sensors of the third example module.

The higher the SEM magnification, the smaller will be the maximum scan deflection on the specimen to cover the field of view and the smaller will be any change in efficiency in signal detection at different positions within the field of view. However, for a typical SEM at a fairly low magnification of 200×, the width of the field of view will be about 1.5 mm and for the design shown in FIG. 8 for example, the variation in collection solid angle with position can result in a few percent variation in response over the field of view. The BSE signal can differentiate materials of different composition and signal thresholds can therefore be defined to delineate regions of different materials within the field of view but when the average atomic number of the materials are similar, any spatial variation in signal collection efficiency will make this delineation unreliable. Therefore, the extent of this non-uniformity of response is particularly important for the BSE signal. The physics of BSE emission is well known and can be simulated by Monte Carlo techniques so that the distribution of backscattered electrons as a function of both angle and energy can be predicted. For a detector module with dimensions shown in FIG. 8, where the entrance surface of the BSE sensors is positioned 5.8 mm above the surface of the specimen, the relative response for the sum of the two BSE sensors for a 20 keV incident electron beam is shown in FIG. 11 for various positions in a square field of view 1.5 mm in width. The positions are from the same aspect as FIG. 8 where the view is from the specimen. When the beam position is at top left or bottom right of the field of view, it is closest to one or other of the two BSE sensors and the sum response is 3.3% greater than when the position is on the central axis. When the beam position is top right or bottom left, it is further away from both sensors and the sum response is 3% less than for the central position.

Figure 12:
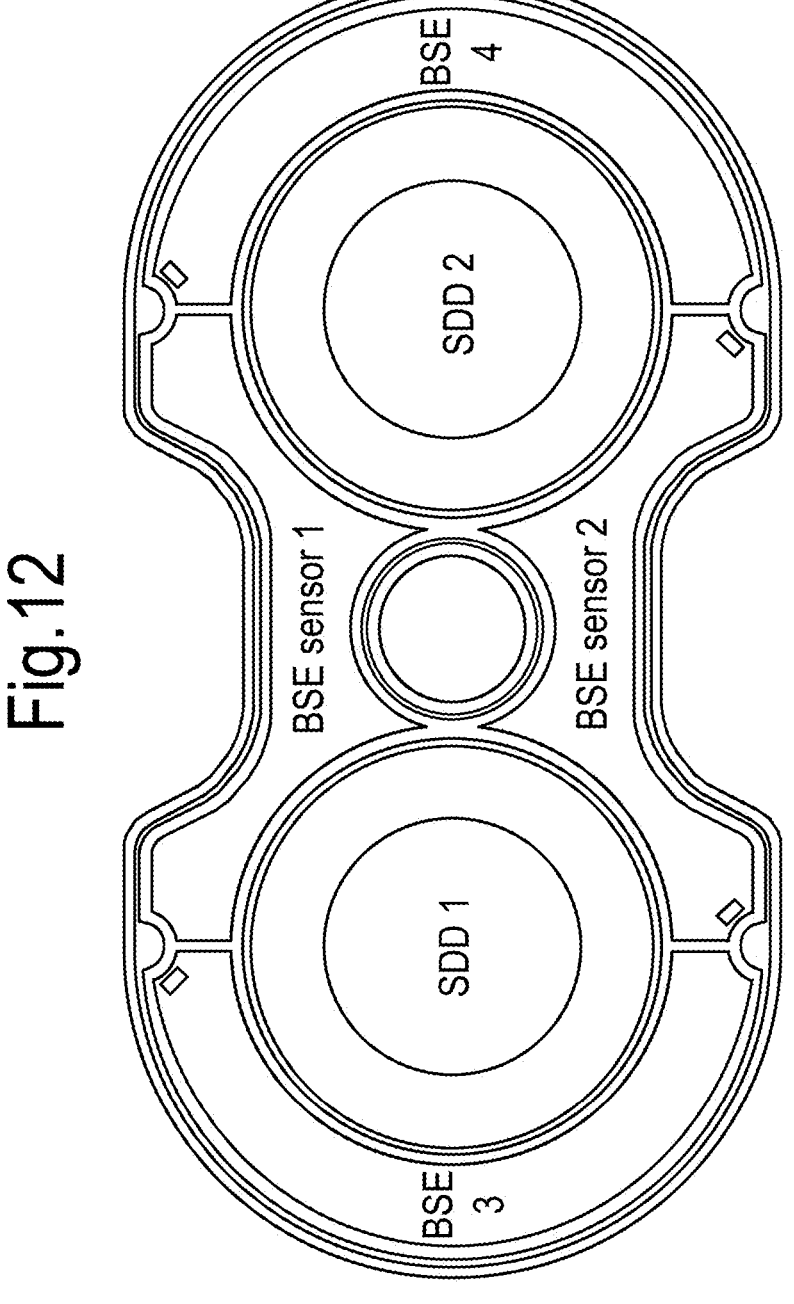
FIG. 12 is a plan view of a fourth example detector module arrangement according to the invention comprising two circular X-ray sensors either side of a central hole and four BSE sensor segments with two-fold rotational symmetry.

For applications where this non-uniformity of response for large fields of view is unacceptable, the conventional solution would be to use a full disk or a 4-fold symmetric segmented BSE detector of the type included in FIG. 2 or FIG. 6 for example. However, this would entail moving the SDD X-ray sensors further away from the beam axis and compromising the collection solid angle for X-ray detection. The alternative approach of putting a ring of BSE sensors outside the X-ray sensors would reduce the BSE signal per unit area of sensor because it is well known that the intensity of BSE electrons decreases approximately as the Cosine of the angle of emission with the normal to the surface. Increasing the diameter of the module to improve either the BSE or the X-ray sensitivity would increase the chance of obstructing other equipment in the SEM chamber or the line of sight of a detector mounted to one side. To avoid these compromises, we have invented a way of achieving a more uniform BSE response over a large field of view for an oval module that only has 2-fold rotational symmetry that is exemplified by the module shown in FIG. 12, the length of which is 26.5 mm. The BSE sensor elements 1 and 2 are closest to the central axis and are therefore most efficient for detecting BSE electrons. The summed response for sensors 1 and 2 would show non-uniformity over a large field of view where the weakest response would be at the farthest ends of a line perpendicular to the vertical line joining the sensors. The additional BSE sensors 3 and 4 on the outside of the SDD X-ray sensors help compensate for this drop in sensitivity. Consequently, when the BSE response for the sum of all the sensors is calculated for the module with dimensions of FIG. 12 where the entrance surface of the BSE sensors is again positioned 5.8 mm above the surface of the specimen, the uniformity of response over a 1.5 mm square area on the specimen is improved as shown in FIG. 13. Here the maximum response is only 0.2% greater than at the central position and the minimum response is only 0.7% less.

The uniformity of total BSE response can be improved still further by increasing the size of BSE sensors 3 and 4 to compensate for the reduction in efficiency compared to sensors 1 and 2 due to the Cosine emission response. However, the change required to improve uniformity would necessarily increase the length of the module and this would increase the chance of obstruction of other auxiliary devices within the SEM chamber. Instead of increasing the diameter, the response of BSE sensors 3 and 4 can be amplified by electronic, digital or software computation methods to compensate for the loss of signal due to the Cosine emission response. For the module in FIG. 12, if amplification is used to give a result that is equivalent to the sum response for sensors 1 and 2 added to 3.3 times the sum response for sensors 3 and 4, the result for the same 1.5 mm square area is shown in FIG. 14. Here the minimum is the same as in the central position and the maximum response is only 0.2% greater.

The factor 3.3 required to minimise the non-uniformity of response over a 1.5 mm×1.5 mm field of view of beam positions on the specimen is a function of the shape and position of sensors on the module and their distance from the specimen. A factor of 1.0 would give the same response with position as shown in FIG. 13 and factors between 1 and 3.3 give an intermediate improvement in uniformity over that same area. Although the uniformity is improved with this amplification of the signals from sensors 3+4, the noise in that part of the signal is also amplified. The minimum noise is fundamentally limited by the flux of electrons hitting the sensor and the smaller the sensor, the bigger the noise. Therefore, the larger the amplification factor, the more the noise in the overall response will be increased so there is a trade-off between improved uniformity of response with beam position and a reduction in signal-to-noise of the overall response. It would be possible to break the BSE sensor into more segments and apply different levels of amplification before summing the signals to further improve the uniformity of spatial response.

The same design principles that have been used to improve the uniformity of BSE spatial response for the combined X-ray and BSE detection module could be used for any BSE detector where an oval shape is required. Whereas the conventional approach is to make the segments cover the full 360 degrees around the central axis or have at least 4-fold rotational symmetry, for an oval detector with 2-fold rotational symmetry, the non-uniformity in spatial response for the sensor regions either side of the centre in the narrowest region of the detector can be compensated by adding in a signal with a different level of amplification for some of the sensor regions either side of the centre in the widest part of the detector, thus providing a more uniform BSE response for different beam positions on the specimen.

Figure 8:
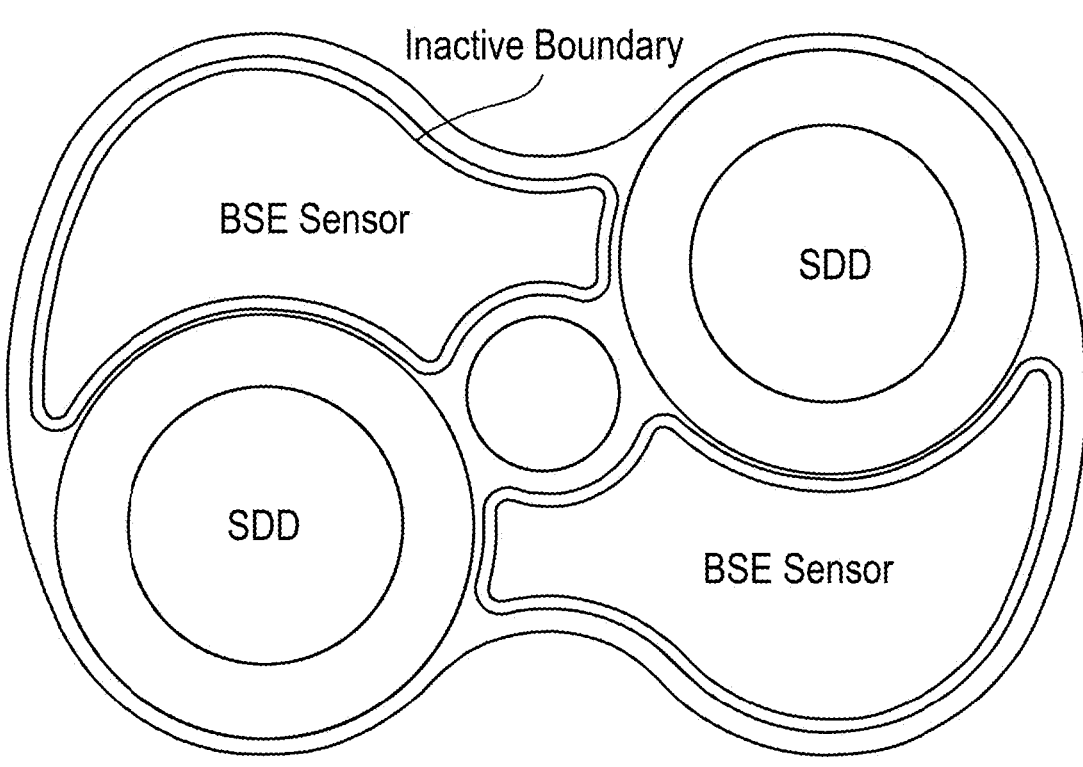
FIG. 8 is a plan view of a third example detector module arrangement according to the invention comprising two circular X-ray sensors either side of a central hole and two BSE sensor segments with two-fold rotational symmetry.

The best BSE signal response per unit area is obtained when the active area of the sensor is close to the central beam axis. However, in order to maximise the X-ray sensor response, it is also desirable to position the X-ray sensor active areas close to the central beam axis to maximise collection solid angle. When the BSE sensors are manufactured from a silicon wafer, the individual sensors are cut away from the wafer and this can damage the surface at the periphery. A similar problem arises for the X-ray sensors and to prevent breakdown or leakage when the electrical connections are made it is necessary to include an inactive boundary around each sensor active area. The inactive boundary for a BSE sensor is shown in FIG. 8. When this inactive boundary is near to the central axis of the module, useful signal is wasted so it is desirable to reduce the extent of the inactive area. One way to reduce the inactive area is to fabricate both BSE sensors and X-ray sensors on the same semiconductor wafer so that there is no need to cut them out individually. This would achieve a cross section similar to FIG. 3 but without the gaps between the BSE and X-ray sensors.

An alternative method to correct for the non-uniformity of response with beam position is to calculate the response for a particular design using knowledge of the sensor to specimen distance. Thus, a response surface like that in FIG. 11 can be calculated and used to modulate the measured response with position so that values of the modulate signal response can be stored in a digital image of the field of view that has good uniformity. A further alternative is to measure the response when the module is positioned at a particular distance from the specimen using a flat and homogeneous specimen such as a piece of polished copper or nickel. When a digital image over the desired field of view is recorded, the values at individual pixels provide a calibration of the relative signal response under these conditions. When a specimen of interest is then studied using the same conditions as for the calibration, the signal response can be modulated using the values from the calibration image in order to correct for non-uniformity.

A similar problem of non-uniformity occurs for the X-ray sensors that also have only 2-fold rotational symmetry. The X-ray signal does not fall off as the Cosine of the angle of emission with the normal to the surface but is still affected by the collection solid angle for emissions from the beam position. As with the case of the BSE sensors, the non-uniformity of response over a field of view can be corrected either by calculation of the response or by calibrating the response at different beam positions by measuring the response for a flat calibration sample with homogenous composition under the same microscope conditions. Whereas the BSE sensors produce a single value representative of the BSE emission from the beam position on the specimen, the X-ray sensors produce a histogram equivalent to the energy spectrum of X-rays emitted from that position. Typically, an X-ray map showing spatial distribution of a chemical element will be obtained by recording, at each beam position, the contribution to the spectrum from only the characteristic energy emissions of that element. If such a map is recorded over a large field of view, even if the sample is homogeneous, the change in total collection solid angle with position will produce a non-uniform map. If it is not possible to calculate or calibrate the response to correct for this non-uniformity, an alternative option is to use the ratio of the characteristic emission counts to the total spectrum emission counts, rather than just the characteristic emission counts alone, at each pixel position in the map. Since the total spectrum emission counts are subject to the same collection solid angle, the ratio will not be affected by variations in collection solid angle with beam position and thus the ratio map will be more uniform than the map of characteristic emission for the element.

In any of the present example sensor arrangements, the X-ray sensors can be covered by a filter material to prevent BSEs from saturating the X-ray sensor while permitting low-energy X-rays to reach the sensors. The filter may be constructed of multiple layers of different materials to optimise transmission for important X-ray characteristic emission lines while still blocking transmission of BSE. If the specimen is cathodoluminescent or the specimen or other apparatus in the vicinity emits visible light or infra-red (IR) radiation it may also be beneficial to block these additional sources of radiation from reaching the X-ray sensor and adversely affecting the measurement of the X-ray energy spectrum emitted by the specimen. If the materials for blocking the BSE does not block light or IR then additional layers may be required for this purpose. At least one material layer must be electrically conductive and be connected to ground or a current sink to prevent the filter accumulating electrical charge and reaching a voltage potential enough to interfere with the operation of the electron beam optics and scanning system.

The filter material may consist of a self-supporting foil such as a thin layer of mylar or polyimide that has a conductive coating of aluminium or carbon. A typical filter a few microns in thickness can be removed and repaired if damaged. The filter for blocking BSEs may alternatively consist of a coating applied directly to the surface of the X-ray sensor. For example, a coating of 150 nm of Aluminium or 34 nm of Palladium would be adequate to stop BSE up to 3 keV in energy but would still transmit low energy X-rays from carbon, nitrogen, and oxygen. A coating of 350 nm of Aluminium would stop BSEs up to about 5 keV in energy. Such coatings would transmit low energy X-rays much better than the 6-micron mylar filter of FIG. 4 that severely attenuates X-rays below 1 keV. If a coating is applied directly to the X-ray sensor surface sufficient to block BSEs when the SEM is operated with a low incident beam voltage, then a removable self-supporting foil can be added to allow the module to be used when the SEM is operated at higher incident beam voltages. Thus, the module can be configured with or without a foil filter to optimise X-ray detection at different SEM beam voltages. If the module is operated without foil filters in order to maximise X-ray sensitivity for low energy X-rays, it is beneficial to operate the X-ray sensors at a lower temperature to improve the energy resolution in the X-ray spectrum for low energy X-rays. If foil filters are used, then the X-ray sensors can be operated at temperatures closer to room temperature because the energy resolution is less critical for the higher energy X-rays that will be detected with a foil filter in place. Operating at higher temperatures is beneficial in that it reduces the power requirement for the module cooling and reduces the chance of condensation or ice forming on the sensors. Condensation or ice formation is more likely to occur in an SEM that can be operated in a "low vacuum" or "environmental" mode suitable for analysis of hydrated specimens. Therefore, the ability to configure the degree of cooling allows the temperature of sensors to be adjusted to optimise performance to suit different operating modes of the electron microscope.

With the module in position 106, there is a risk that the specimen stage may be accidentally driven so that the collision with the stage or specimen 101 damages the sensors in the module. Each sensor may therefore have a protective aperture closer to the specimen than the sensitive entrance surface of the sensor to prevent the specimen from damaging the surface when the specimen stage is accidentally driven too close to the sensors. Each sensor will typically be behind an aperture in a conductive plate that can be used as one electrode of a capacitive sensor that monitors the proximity of the specimen and/or specimen holder. The other plate may be formed from the specimen holder, ideally connected to the conductive specimen or a conductive coating on the specimen. With this arrangement, the proximity sensor can be calibrated when the specimen is positioned at the closest safe distance from the module so that a warning can be given, or stage movement restricted with an interlock, to prevent accidents while the user is using stage movements to explore the specimen.

Figure 15:
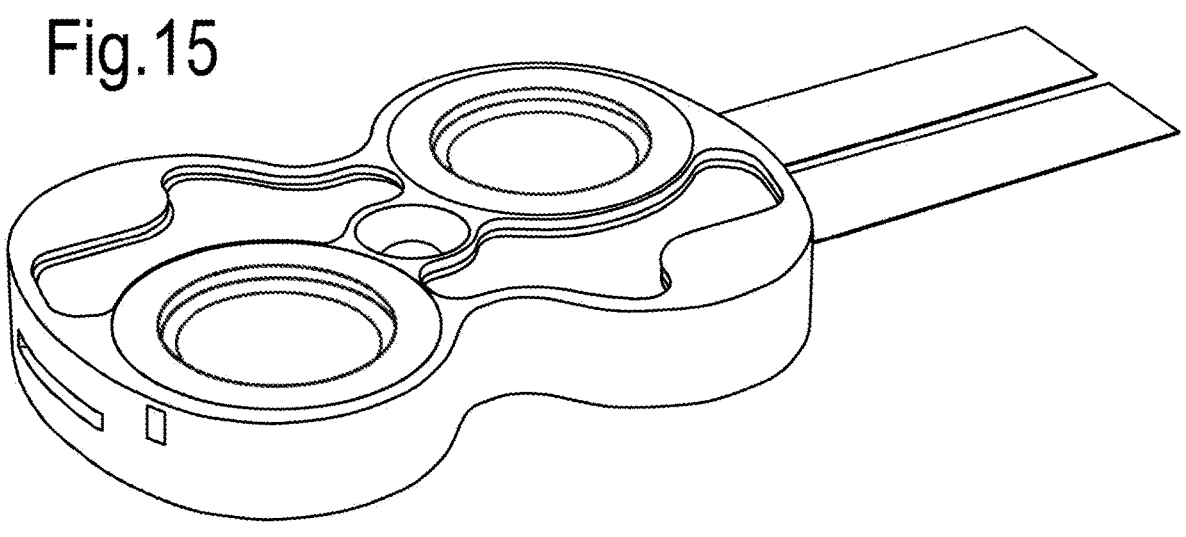
FIG. 15 is a perspective view of the third example detector module, showing the connector for providing bias voltages for the sensors, power for the thermoelectric cooling and to take out sensor signals to external electronics via a vacuum feedthrough, in which two circular X-ray sensors and two BSE sensors are shown which face the specimen in use.

The module needs to be connected to external electronics to obtain voltages to bias the sensor elements, power for any thermoelectric cooling stacks and to take out signals from the BSE and X-ray sensors and any temperature sensor. FIG. 15 shows a 3D rendition of the module showing an example of where a connector can be attached to the module for these purposes. In addition, the module will require some means to take heat away from the module to a heat sink. The module could either be mounted on the pole-piece of the final lens and conduct heat to the metal of the polepiece or be mounted on a support with a thermal conductor to take heat away to the metal walls of the microscope or to a heat sink or cooling device outside of the microscope. Alternatively, the module could be mounted on a support arm that extends from a side port on the electron microscope and can be inserted into the operating position beneath the polepiece or retracted away to the side so that other devices can be brought into position below the polepiece or the specimen itself can be brought closer to the polepiece. In this case, the support arm can also be the conduit for conducting heat and containing any electrical wires or conductors that connect the module to external electronics.

Figure 16:
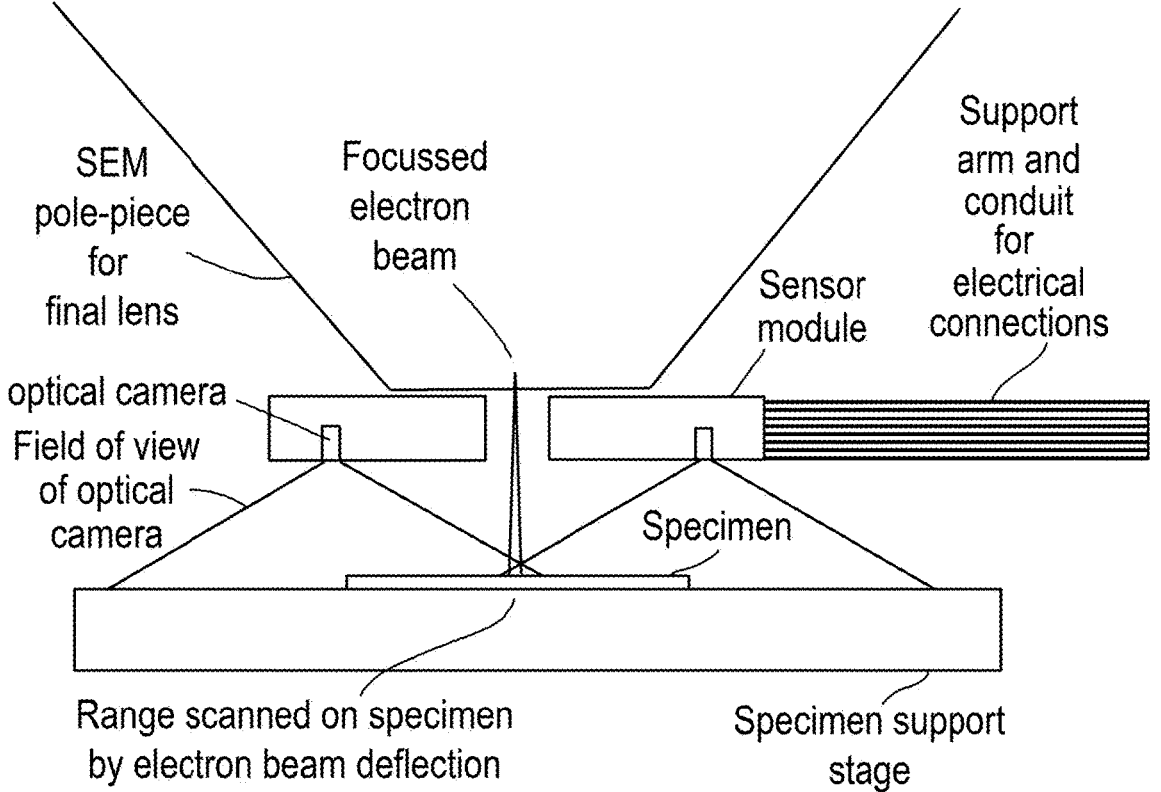
FIG. 16 is a schematic side view of an example arrangement according to the invention comprising optical cameras immediately below an SEM polepiece.

As explained above, because the SEM image obtained by deflecting the beam covers a very small range on the specimen, it is difficult for the operator to know where exactly the area is on the specimen without a large area view. If a camera can be positioned close to a vertical direction directly towards the specimen to avoid excessive perspective distortion, the camera image of the specimen surface will help the operator locate the area scanned by the electron beam relative to the surrounding specimen surface, provided the field of view is large enough. It is desirable to keep the distance between the final lens pole-piece and the specimen less than 10 mm to achieve good SEM imaging performance so any camera must not only be very small in order to maximise the camera-specimen distance but also must have a short focal length and good depth of field to maximise the field of view (e.g. The Omnivision OVM6946/8 wafer level camera with external dimensions 1.1×1.1×2.2 mm). With a camera to specimen distance of less than 10 mm, a field of view at least 10 mm wide can be achieved with a single camera and any "fish eye" distortion of the camera image can be corrected by well-known image correction methods. Furthermore, the depth of field of the camera is sufficient to allow the camera to specimen distance to be increased, by adjusting the vertical height of the specimen stage, to provide a much wider field of view of at least 20 mm and ideally more than 60 mm. A sensor module that fits under the pole-piece and only contains BSE sensors can be fitted with one or more miniature cameras with electrical connections fed through the same conduit used to support the sensor module and insert it into position under the pole-piece. Similarly, a novel detector module with a combination of X-ray and electron sensors as shown for example in FIGS. 8 and 10 can also be fitted with one or more miniature cameras. Because visible light may damage the sensitive photomultiplier tube (PMT) used in a typical Everhart-Thornley SE detector, an infrared (IR) light source (typically around 900 nm wavelength) is required to illuminate the specimen when the PMT is in operation. This source can be provided either by small IR LEDs in the module or by a larger IR source mounted on the support arm. Visual light LEDs can be used to illuminate the specimen when the PMT is known to be inactive. Preferably, the source of illumination, whether IR or visual light, is only switched on for the time required to obtain an optical image of the specimen because the light photons may also interfere with the operation of the sensors for X-rays and BSE and cause excess noise in those sensors for example. FIG. 16 shows a cross section illustrating the large field of view achieved by miniature optical cameras mounted within a sensor module compared to the very small field of view that is covered by the SEM electron beam scan area.

If the working distance, WD, between final lens polepiece and the probe spot where the focussed electron beam strikes the specimen surface is kept constant, then, provided the camera position is fixed relative to the pole-piece, the position coordinates of the probe spot within the digitised camera image will remain constant. These position coordinates can be determined from a specimen that has a small feature, particle or fiducial mark that can be easily recognised in both SEM electron image and optical image. The feature is brought into the centre of the field of view of the SEM electron image (typically the SE image) and the height of the stage adjusted to bring the feature surface into focus at a specific WD. A digital optical image is obtained from the camera and the position coordinates of the recognisable feature within the image are determined. After these position coordinates have been determined, for any specimen being analysed, provided the SEM beam is focussed at the same WD on the specimen surface, an optical image can be recorded and the position of the specimen surface at the centre of the field of view of the SEM image will be at the same position coordinates within the optical image. If the pixel at these coordinates is highlighted within a visual display of the optical image (e.g. using cross hairs or a box centred on this pixel, scaled to the size of the SEM electron beam scanned field of view) the operator can check where the analysis position is located within the large field of view covered by the optical image. An alternative method to determine the location of the probe spot is to make the probe spot visible to the camera while the focussed beam is striking the specimen. When the source of illumination is switched off, if a cathodoluminescent specimen, such as ZnS or MgO or phosphor material, is placed under the focussed electron beam, the point where the beam strikes the specimen will be visible to the optical camera as a bright spot centred on the probe spot. Also, in some specimens, a stationary focussed beam may generate enough IR radiation to be detected by the camera. Thus, the coordinate location of the probe spot within the large field of view image of the optical camera can be established for such special specimens. For any other specimen, provided the SEM beam is focussed at the same WD on the specimen surface, if an optical image is obtained, the analysis position can be highlighted within a visual display of the optical image, as just described, to help the operator check that the desired region of the specimen is being analysed. Furthermore, if the optical image is corrected for spatial distortion, the relationship between digital stage positioning coordinates and the pixel coordinates for the corrected optical image can be established if the operator moves the stage so that a set of recognisable features that act as fiducial marks on the optical image are each brought under the electron beam. Once this relationship between optical and stage coordinate systems is established, the operator can used digital stage control to position the electron beam on any point of interest that is visible on the optical image without having to capture new optical images.

Typically, the specimen surface is arranged to be at a WD that is optimum for SEM imaging or for analysis. An accessory X-ray detector mounted at the side of the SEM typically is arranged to point towards a point in space on the electron beam axis that is at a specific WD so for accurate results with X-ray analysis, the specimen surface is arranged to be at this WD which may typically be 10 mm or less. A much wider field of view can be captured by the optical camera if the specimen stage can be lowered (e.g. by adjusting the stage Z control) to increase the WD. For example, if the camera to specimen distance is 20 mm, a miniature optical camera with a 120° angle of view can capture an area 69 mm wide on the specimen. An optical image recorded with the specimen lowered can be calibrated using techniques just described to establish the relationship between stage position coordinates and optical image pixel coordinates so that the operator can select a feature of interest in the optical image and use the pixel coordinates in the image to determine what X-Y stage position will bring that feature directly under the electron beam. The stage Z control can then be used to raise the specimen surface back to the optimum WD for analysis and the operator can then refer to the optical image to drive the stage to bring any desired feature into the optimum position for analysis.

If two optical cameras are used and are symmetrically disposed about the electron beam axis as shown in FIG. 16 but either the orientation of the cameras and/or the distance between the cameras is adjusted so that there is a substantial overlap in the fields of view of the two cameras, then the two images acquired at the same time can be used to form a "stereo pair". If these images are displayed separately to the left and right eye of the operator, the operator can see the illusion of depth by means of stereopsis for binocular vision and see the surface topography of the specimen in 3D. Alternatively, the two digitised images can be processed with a stereophotogrammetry algorithm (e.g. D. Samak, et al, "3D Reconstruction and Visualization of Microstructure Surfaces from 2D Images", CIRP Annals, Volume 56, Issue 1, 2007, Pages 149-152) that identifies the pixel coordinates in each image for the same feature and uses parallax to determine the relative distance of the feature from the cameras. If a feature on the specimen surface is first arranged to be at a specific WD from the final lens (for example by moving the stage height to focus the electron beam on the feature when the SEM lens is set to focus at a specific WD) and images are acquired from the two cameras and then processed by the stereophotogrammetry algorithm, the distance WD, of the feature from the final lens pole-piece can be used to calibrate the result so that the distance from the pole-piece of any other feature that is visible in both optical images can be determined. After this calibration, the surface of any specimen introduced into the SEM can be examined by acquiring a stereo pair of optical images and processing these images to check that the surface is at a suitable WD and orientation (surface tilt) for analysis. If the specimen is not at the suitable orientation, the user can correct its orientation by tilting the stage.

The combination of optical cameras with BSE and/or X-ray sensors in a module beneath the pole-piece provides unique benefits to aid the navigation and discovery of regions of particular material content on a specimen surface.

Figures 4, 5:
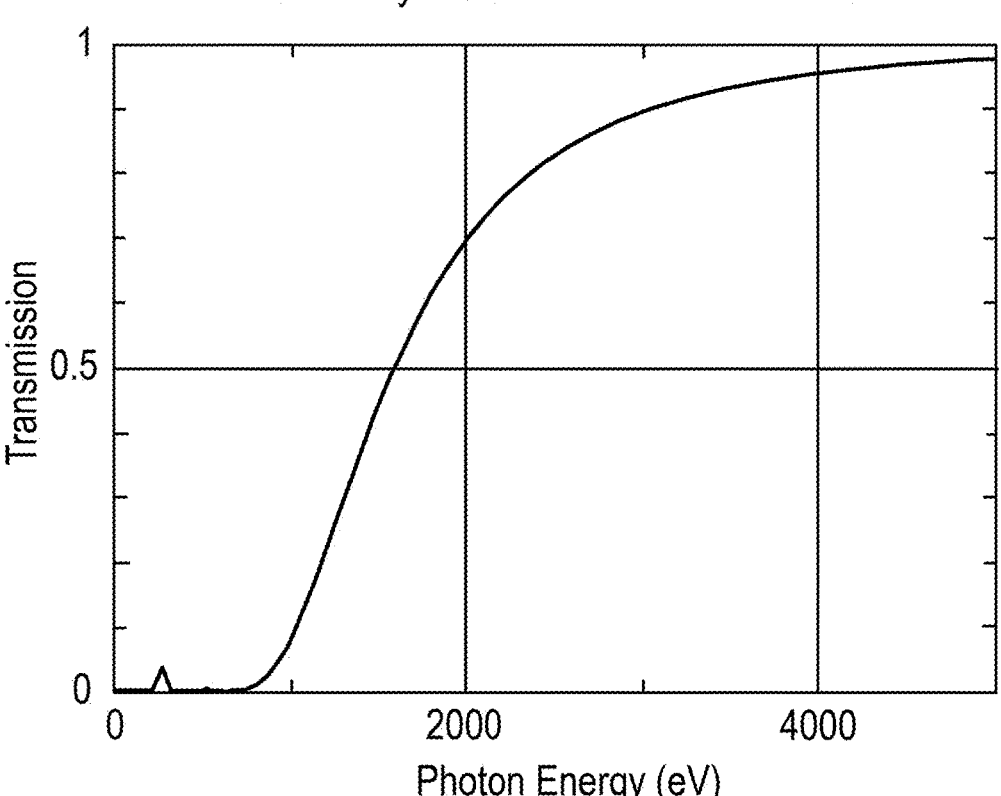
FIG. 4 is a graph showing the dependence on X-ray photo energy of X-ray transmission through a 6 micron thick Mylar filter.
FIG. 5 shows schematically a second arrangement for X-ray analysis in an electron microscope according to the prior art in which there is partial occlusion of a line of sight of side-mounted detector by a large-diameter detector module below a microscope polepiece.
Figure 17:
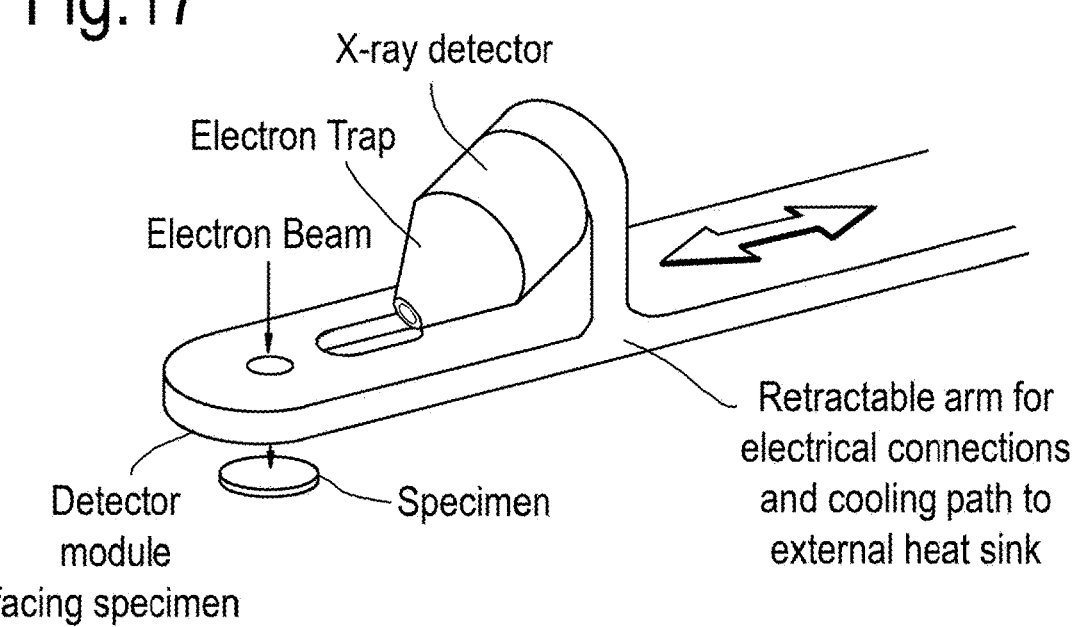
FIG. 17 is a perspective view of an example arrangement according to the invention comprising a retractable side arm supporting a downward-facing detector module under the polepiece with an additional accessory X-ray detector with integral electron trap mounted in position with an unobscured line of sight to the probe spot on the specimen.

A common example of an accessory device is a conventional X-ray detector that is mounted in a side port of the electron microscope as shown in 105 of FIG. 5. The accessory detector is far enough away from the specimen to include an electron trap to prevent backscattered electrons entering the detector while allowing low energy X-rays to pass through without attenuation. The electron trap typically consists of one or more pairs of permanent magnets or a circular Halbach magnet array to generate a strong field to divert any BSEs travelling towards the detector and some soft iron enclosure to limit the stray field so that it does not interfere with the focussing optics of the electron microscope (see for example U.S. Pat. No. 8,049,182 B2). Such an accessory detector with electron trap will have much better sensitivity to low energy X-rays than the X-ray sensors in the module below the polepiece that require filter material to block BSEs. If the under-polepiece module is introduced on a support arm that extends from a side port, an accessory X-ray detector with integral electron trap can also be mounted on the same support arm. The advantage of this arrangement is that only a single electron microscope port is required and the conduits in the support arm can accommodate the electrical and cooling requirements for both the under-polepiece module and the accessory X-ray detector. An example of this arrangement is shown in FIG. 17. The additional device with clear line of sight to the specimen probe spot can be an X-ray detector, as shown, or could be other devices such as a cathodoluminescence detector, laser, micromanipulator or gas injector that are small enough to be mounted on the side support arm.

Figure 18:
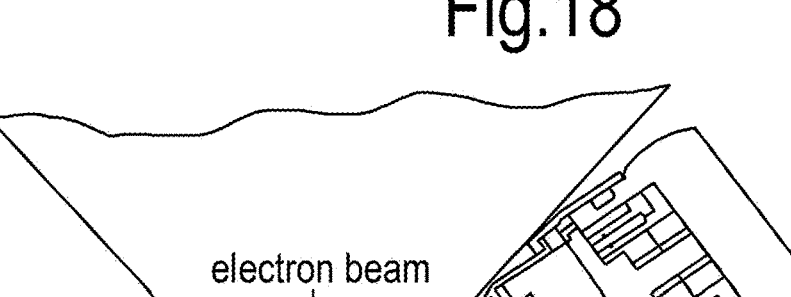
FIG. 18 shows a side view and a plan view of the example arrangement shown in FIG. 17 in position beneath the final lens polepiece.
Figure 18:
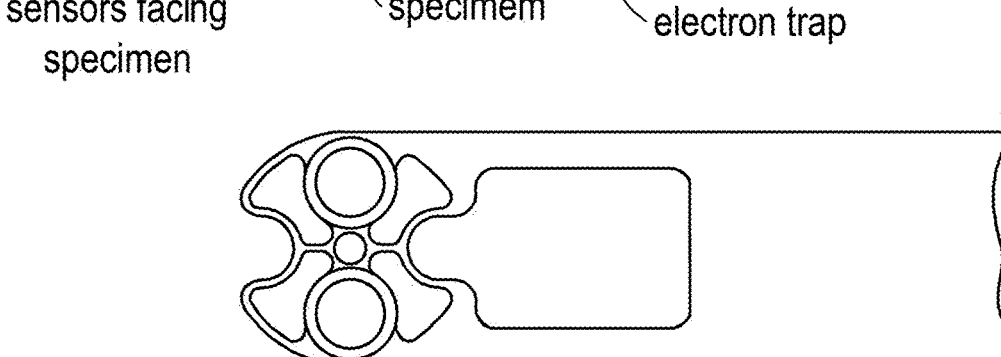

If the accessory detector is mounted in a fixed position relative to the detector module, the module can be designed to ensure all sensors have clear line of sight of the probe spot on the specimen. FIG. 18 shows a side and plan view of one configuration according to FIG. 17 where symmetric cut-outs are used to retain 2-fold rotational symmetry for the BSE sensors and the cut-out enables clear line of sight for the accessory X-ray detector fitted with an electron trap.

The under-polepiece module may have limitations with respect to spectral quality when it is required to map and identify regions of different elemental composition. For the module, sensitivity to low energy X-rays will be reduced because of the presence of the filter material that is in front of each X-ray sensor in order to block backscattered electrons. The module may be operated at higher temperature or other conditions that may lead to added electronic noise that degrades spectral resolution and broadens characteristic spectral peaks. The processor used to analyse the pulse stream from the X-ray sensors may have to use very short process time per photon to accommodate the high count-rate and this may also cause an increase in electronic noise that broadens spectral peaks. If the filter used to block BSE is too thin, the energy spectrum from the module X-ray sensors may show an enhanced background contribution due to BSE. There may be "pile-up" or "coincidence" artefacts in the spectrum that arise from measurements of photon energies that have been corrupted because the photon-induced pulses arrived too close together in time to be detected as separate events. Furthermore, additional spectral artefacts may arise from X-rays that are generated outside of the specimen or from electrons that have penetrated through the filter material and reached the X-ray sensor If an accessory X-ray detector is installed to one side of the module (e.g. like 105 in FIG. 5), the solid angle subtended by the detector active area at the point where the incident electron beam strikes the specimen is likely to be much smaller than the total solid angle subtended by X-ray sensors within the module mounted below the polepiece (e.g. in position 106, FIG. 5). Consequently, the count rate for X-rays entering the accessory X-ray detector may be much lower than the count rate from the module. The accessory X-ray detector may itself include multiple X-ray sensors and may or may not be able to accommodate high photon count rates. However, the sensitivity of the accessory detector to low energy X-rays can be much higher than for the module if it is fitted with an electron trap and thus avoids the need for a material filter to stop BSEs reaching the sensor. The accessory X-ray detector can also use collimators to restrict the field of view and reduce artefacts from X-rays outside of the specimen area. Thus, there are reasons why the spectrum obtained from an accessory detector may be a much better indicator of detailed elemental composition of the specimen than is the spectrum obtained from the module that may be more subject to artefacts and less sensitive to low energy X-ray emissions. In some configurations there may be more than one accessory detector with a view of the specimen in addition to the module.

In the scanning electron microscope, beam deflection is used to position the beam on a 2-dimensional grid of points on the surface of the specimen and data is acquired while the beam rests at each point. The points correspond to pixel positions in a digital image of the scanned region on the specimen. At each pixel, a vector of data is acquired from the X-ray sensors in the module that corresponds to the X-ray energy spectrum generated at that pixel. Additional signals may be recorded from the electron sensors in the module. A vector of data is also recorded from each of the one or more accessory detectors.

The pixel data obtained from the module represents a "hyperspectral image" where there is a "data vector" at each pixel position. The data vector can be a histogram of X-ray photon energies representing the X-ray spectrum that is characteristic of the material excited by the incident electron beam at that point. The histogram could typically consist of 2000 bins or channels where each channel value represents the count of photons within an energy range of 10 eV, thus spanning a total energy range of 20 keV. Although using this full data vector of 2000 values can be used, a much smaller data vector may be obtained by summing counts in contiguous energy regions. For example, if the counts in groups of 10 channels spanning 100 eV are aggregated, the data vector representing the spectrum would be reduced to 200 values where each value represents the number of photons recorded in an energy range of 100 eV. Rather than being fixed, the number of channels to be aggregated could vary so that the aggregated counts correspond to an energy range which varies with energy. For example, each range could be made proportional to the energy resolution of the spectrometer at that energy, to give a reduced data vector that still contains enough information to differentiate between spectra from different materials. Alternatively, an even smaller data vector may be derived by only summing data from a series of energy ranges that are not necessarily contiguous and where the limits of each energy range are chosen to maximise the likelihood of obtaining information that would help detect regions of different composition, for example using the techniques described in U.S. Pat. No. 7,533,000. The energy ranges may also be positioned at the energies for important characteristic element emission lines or to accumulate a signal that is dominated by bremsstrahlung radiation. A data vector value that corresponds to the X-ray photon count from an energy region dominated by bremsstrahlung emission will be strongly dependent on a weighted mean atomic number of the specimen whereas a data vector value from an energy range straddling a characteristic element emission line is strongly-dependent on the mass concentration of the element in the specimen. Typically, the sum of signals from electron sensors that are symmetrically disposed around the electron beam axis is indicative of a weighted mean atomic number of the material and is a monotonically increasing function of atomic number for pure elements. However, some multi-element materials with different chemical composition may have similar weighted mean atomic number and give similar backscatter electron signals so electron signals alone may not always be able to differentiate materials. However, a data vector composed of a combination of X-ray data and electron signal measurement is more likely to be able to differentiate between pixels from regions of different chemical composition than just X-ray data or electron signal data alone.

In an electron microscope, the intensity of the backscattered electron signal and the X-ray signal will be directly affected by the current in the electron beam striking the specimen. During data acquisition, it is likely that the beam current may drift or fluctuate. Since both X-ray and BSE are affected to the same extent by changes in beam current, the data vector can be made independent of beam current by scaling the values derived from the X-ray spectrum by a factor inversely proportional to the BSE signal. Thus, for example, if an X-ray photon count from an energy region is X and the BSE signal is B, then the scaled data vector value would be $C \cdot X/B$ where C is a suitable constant. If all derived X-ray count values are scaled in this way, then even if the beam current drifts during the acquisition, the data vector from anywhere in the scanned region will now be similar if the same material is under the beam. Furthermore, since the BSE signal will vary with the mean Z of the specimen material, then even though the module X-ray sensors may not see X-rays from low Z elements, the scaled data vector values will be sensitive to the effect that low Z elements have on the mean Z of the material.

If the module X-ray sensors are fitted with material filters to prevent BSEs from entering the sensors, the response to low energy X-rays will be very poor. For example, when a filter is used to block BSEs up to 20 keV in energy, there will be little useful information content in the X-ray energy spectrum obtained by the module for X-ray energies below 1 keV. Although an accessory X-ray detector will collect a much smaller fraction of generated X-rays than the module, there will be useful spectral information for X-ray energies below 1 keV. Therefore, the spectrum of X-rays obtained by an accessory X-ray detector for energies below 1 keV can be used to augment the data vector derived from the module data. A data vector that includes this additional information from an accessory detector for low-energy X-rays will be better able to discriminate materials that contain low atomic number elements such as boron, carbon, nitrogen, oxygen and fluorine for example.

When an electron beam is scanned over a region of the specimen, the field of view on a specimen can be considered to be covered by a grid of n positions denoted by coordinates $x_i$, $y_i$ (i=1,n) where i is a pixel number in a digital image. Hyperspectral data array M consists of n data vectors $m_i$ for pixel numbers i from 1 to n that correspond to a digital image of the field of view. Each data vector $m_i$ includes data acquired while the beam is positioned at the i'th pixel location on the specimen and consists of $L_m$ values where values typically represent component intensities derived from the X-ray spectrum from the module but, as explained above, some values may be derived from the X-ray spectrum from an accessory X-ray detector and one value may be the backscattered electron signal measurement. Preferably, for each of the $L_m$ values in the vector, a measurement uncertainty is estimated. If the k'th value in the vector $m_i$ for pixel number i is designated by $m_{ik}$ and its associated measurement uncertainty by $\sigma_{ik}$, then if p and q are the pixel numbers for two different locations on the specimen, a metric can be derived that indicates the difference between the vectors at these two locations. This metric can for example be a standardised Euclidian distance metric using statistical weighting $$D_{pq} = \Sigma[(m_{pk}-m_{qk})_2/(\sigma_{pk}^2+\sigma_{qk}^2)] \tag{1}$$

where the sum is over all values of k from 1 to $L_m$. Small values of $D_{pq}$ indicate that the materials at pixel positions p and q on the specimen are similar in composition. The metric in equation (1) is appropriate when there is a diagonal covariance matrix for the $L_m$ values in the vector (as is the case for X-ray counts accumulated from separate energy bands) and is a special case of the Mahalanobis distance. The inclusion of the measurement uncertainties in this metric puts more emphasis on vector values that have more precision, for example because they represent higher total number of X-ray counts summed in an energy range.

By using a grouping algorithm (e.g. Statham et al, Microsc. Microanal. 19 (Suppl 2), 2013, p752) to aggregate pixels with similar data vectors into groups, regions can be identified where the material under the beam at each pixel is the same. The algorithm identifies groups of pixels that have similar data vectors and assigns them to a "phase" and thus segments the image field into regions corresponding to "phases" that have different material composition. Membership of a phase may for example require that the Mahalanobis distance for a data vector from the average vector for all members of the phase is below a threshold. S/N for X-ray data depends on the counts recorded in the energy spectrum that govern the Poisson statistics and because of the close proximity of the sensors in the module to the specimen, the number of counts recorded in a spectrum from the module may be much higher than for a spectrum from an accessory detector that subtends a smaller solid angle at the specimen. Thus, the signal-to-noise (S/N) of the module data is likely to be much better than the S/N for data collected from any accessory x-ray detector and high S/N improves the ability to reduce the overlap of data vector clouds from materials that are close together in composition. However, although the module data with high S/N can be very useful to help segment the field of view into pixels corresponding to different materials, the spectral quality of the X-ray data from the sub-polepiece module may not be good enough to identify the correct chemical elements present within the different materials. As explained above, the spectrum may include artefacts that could be mistaken for elements that are not present in the material, low energy characteristic X-rays may be missing due to absorption in the filter, spectral resolution may not be enough to resolve some overlapping characteristic spectral peaks and BSEs that have penetrated the filter may add to the spectral background. Nevertheless, because the data vector from the module will act as a "fingerprint" for pixels of the same material, spatial regions of similar chemical composition can be delineated from other regions by using data from the module.

When all the regions of similar chemical composition (or "phase") have been delineated by grouping pixels with similar data vectors, the X-ray spectrum vectors obtained from an accessory detector are summed preferably for all pixels in the phase. It may be necessary to exclude some pixels, for example pixels adjacent to a boundary, as these may be less representative of the true material composition. This may occur if the region of X-ray emission extends beyond the dimensions of a single pixel for example. The S/N for the spectrum obtained with the accessory X-ray detector for that "phase" is thus improved by aggregating many spectra from pixel positions on the same material. Since the accessory detector will have better sensitivity to low energy X-rays and will have been optimised to remove spectral artefacts, conventional spectrum processing techniques can be applied to the aggregated spectrum to identify the elements that contribute characteristic emission peaks to the spectrum and determine the intensities of those peaks.

Thus, data from the one or more accessory detectors can be used to provide a more accurate estimate of elemental composition of the phase than can be obtained from the sub-polepiece module data alone. The combination of the high S/N data from the sub-polepiece module to identify regions of different composition with the more accurate element compositional data from one or more accessory detectors enables accurate element content to be determined for the whole scanned field of view on the specimen.

Figure 19:
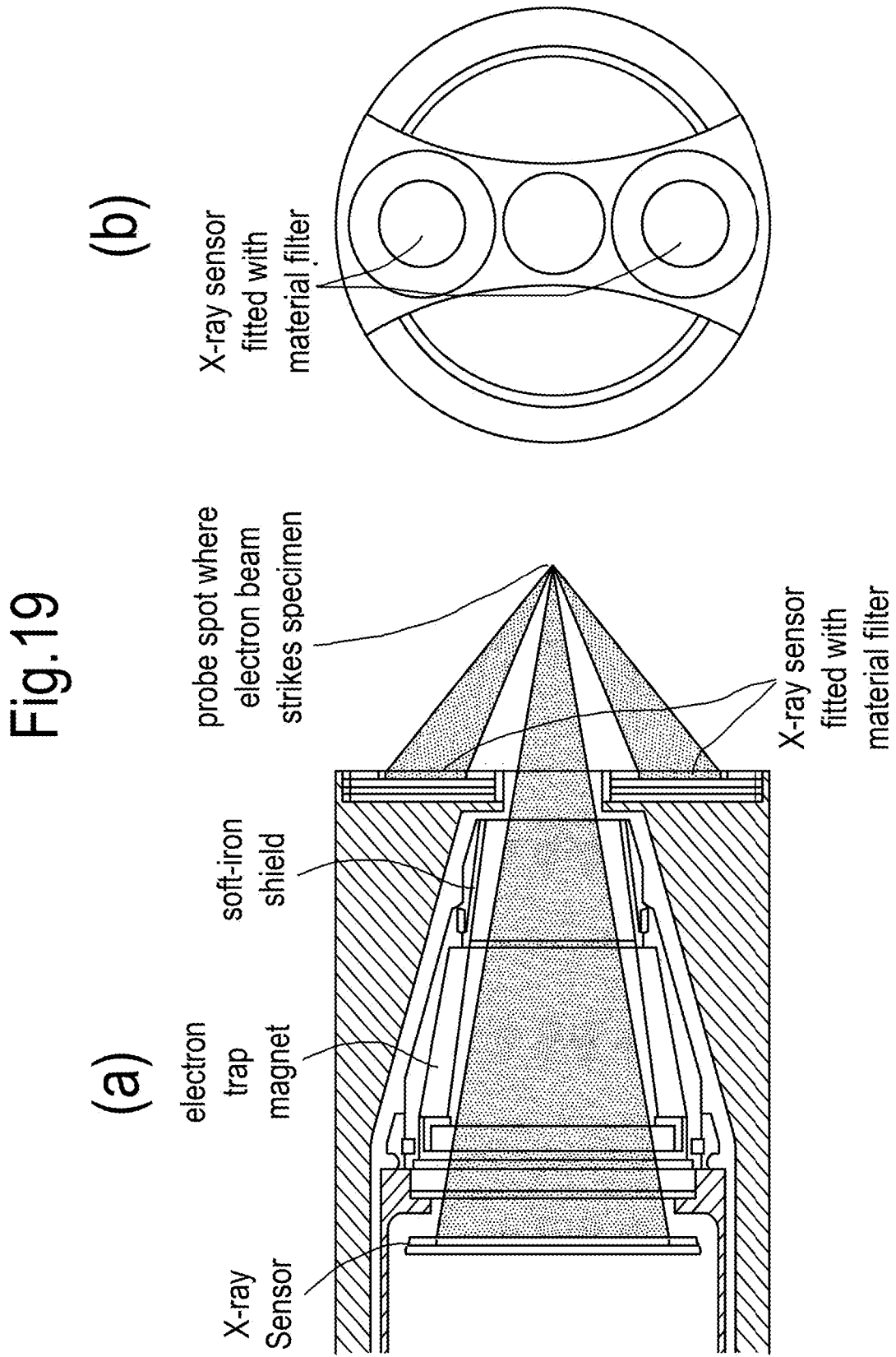
FIG. 19 shows, at (a), a cross section through an example arrangement according to the invention wherein additional X-ray sensors fitted with material filters to block BSEs are mounted on the end of the electron trap that prevents electrons reaching an X-ray sensor that does not have a filter to block BSEs and is more sensitive to low energy X-rays, and, at (b), a view of the module from the direction of a specimen in use, showing the X-ray sensors with filters mounted either side of the entrance aperture of the electron trap.

The principle of segmenting the field of view into regions where the X-ray spectral emission is similar can be used with other types of module that are not necessarily positioned below the polepiece or do not necessarily include any electron sensors. The key requirement is that the one or more X-ray sensors in the module subtend a total solid angle at the probe spot on the specimen that is much larger than the total solid angle subtended by an accessory X-ray detector that has better spectroscopic performance. An electron trap, such as one that uses a magnetic field to deflect electrons so that they do not reach the X-ray sensor, needs to be interposed between specimen and X-ray sensor and this prevents the X-ray sensor from being placed very close to the specimen to achieve a high solid angle for collection of X-ray signal. The advantage of an electron trap is that it does not prevent low-energy X-rays from reaching the sensor. However, if a filter material is used in front of the sensor surface to block electrons, the sensor can still operate effectively when it is positioned close to the specimen. Therefore, a module incorporating X-ray sensors with material filters to block electrons can achieve a much higher solid angle than a detector with an electron trap. Such a detector module can be positioned below the polepiece as in FIGS. 1 and 17 for example, or alternatively it could be mounted in front of a detector fitted with an electron trap. FIG. 19 shows one example where a module with two X-ray sensors is fitted on the end of a detector with an electron trap. The two X-ray sensors will be covered by material filters to block BSEs and achieve a higher collection solid angle than the detector that is behind the electron trap. More sensors fitted with material filters could be fitted on the end of the trap closest to the specimen to achieve even higher collection solid angle. Furthermore, the one or more sensors with material filters could be mounted below the entrance aperture to the electron trap or to either side of the entrance aperture. To get benefits from the module, the statistical precision of the data needs to be significantly better than that for the accessory detector. Therefore, the total collection solid angle subtended at the probe spot by the module sensors should be at least a factor of 3, preferably more than a factor of 5 and ideally more than a factor of 10 times that for the accessory detector.

As described above, the X-ray spectrum obtained from a sensor with material BSE filter that is close to the specimen may be subject to stray radiation and artefacts and will not reveal any characteristic X-ray emission peaks for X-ray photons of low energy that are absorbed strongly by the material BSE filter. However, such an X-ray spectrum will still vary according to the composition of the material under the probe spot on the specimen because of the effect of composition on bremsstrahlung emission and the relative intensities for higher energy characteristic emissions. Furthermore, such an X-ray spectrum will have more counts and lower statistical noise than for a typical spectrum from an accessory detector fitted with an electron trap. Therefore, a Hyperspectral image formed from X-ray spectral data collected at an array of pixel positions on the specimen from one or more sensors covered by BSE filters can be used to segment the field of view into regions of similar composition where pixels have similar data vectors where each value in a data vector is the number of counts recorded for a certain range of X-ray energies. For a set of pixels with a similar data vector (emanating from material of similar composition), the spectra recorded at the same time from an accessory X-ray detector with electron trap can be summed to give a spectrum with improved counting statistics that can be analysed to determine the element composition of the material corresponding to those pixels. In effect, the module data is used to improve the S/N of X-ray element maps or images acquired from an accessory detector and there are alternative ways to achieve this improvement.

Figure 20:
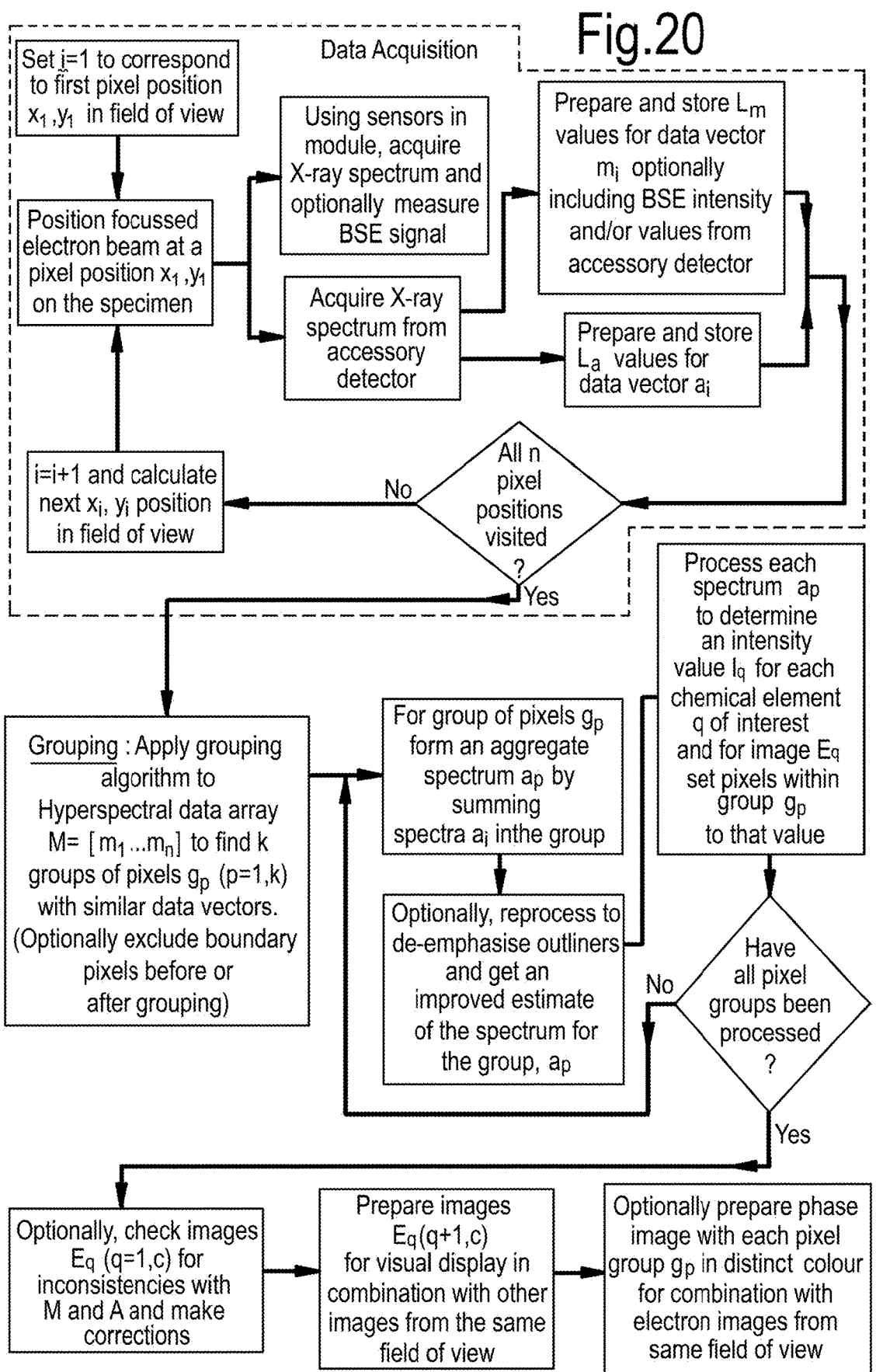
FIG. 20 is a flow diagram depicting a first example data acquisition process according to the invention.

The flow chart of FIG. 20 summarises one procedure for acquiring and combining data from the module and accessory detector to achieve images showing how material composition varies over the field of view. The steps within the dashed box describe the process of data acquisition. When an electron beam is scanned over a region of the specimen, the field of view on a specimen can be considered to be covered by a grid of n positions denoted by coordinates $x_i$, $y_i$ (i=1,n) where i is a pixel number in a digital image. Hyperspectral data array M consists of n data vectors $m_i$ for pixel numbers i from 1 to n that correspond to a digital image of the field of view. Each data vector $m_i$ includes data acquired while the beam is positioned at the i'th pixel location on the specimen and consists of $L_m$ values where values typically represent component intensities derived from the X-ray spectrum from the module but as explained above, some values may be derived from the X-ray spectrum from an accessory X-ray detector and one value may be the backscattered electron signal measurement. Likewise, hyperspectral data array A consists of n data vectors $a_i$ (i=1,n) where each data vector $a_i$ consists of $L_a$ values where each value represents the intensity in an energy band or channel for an X-ray spectrum acquired from an accessory detector when the beam is positioned at the i'th pixel location on the specimen (An accessory X-ray detector will typically obtain a spectrum with far fewer counts than that obtained from the module but with better spectrum fidelity so that estimates of chemical elemental content will be more accurate even though statistical precision is much worse. If more than one accessory detector is available, the X-ray spectral data from all accessory detectors may be combined.

A processing algorithm is used to identify k groups of pixels where a group $g_p$ (p=1,k) includes all the pixels where the data vectors $m_j$ conform to some similarity criterion. For example, a data vector $m_j$ in n-dimensional space may be a member of a group if it is within a certain Mahalanobis distance of the centroid of all vectors in the group and/or if that centroid is the closest one in n-dimensional space but there are many different algorithms available to segment an image into groups of similar pixels (see for example Wikipedia entry https://en.wikipedia.org/wiki/Cluster_analysis). A group of pixels constitutes a sub region of the total region on the specimen covered by the scan and the grouping approach segments the region into sub regions which are not necessarily contiguous in space. It is possible that a group of similar pixels identified using module data M may contain "rogue" pixels that are in positions where the material content is quite different from the average for that group. Such "rogue" data may appear for example for pixels positioned on a boundary between two materials where the observed signals are a mixture of emissions from two different materials; the measured signal vectors from the module may fortuitously cause these rogue pixels to be considered as part of the group. An optional approach to this problem is to exclude data from pixels that are on or near a boundary between dissimilar materials, either by looking at the variance of signals in the neighbourhood of each pixel before the pixel data is considered, or as a post-processing step after the similar regions are identified by grouping and the boundaries can be identified.

In the method of FIG. 20, the data vectors $a_j$ are aggregated for pixels j within a group $g_p$ to form a spectrum $a_p$ representative of the group. If "rogue" pixels have been included in the group because of a failure of the "grouping" procedure to correctly allocate pixels to appropriate groups, $a_p$ may be biased and not truly representative. To reduce this bias, an optional step involves testing all pixels in a group to see whether each data vector $a_j$ within group $g_p$ is within the expected range of variation from the average or median vector for the whole group of data vectors. Any pixels that appear to be outliers to the group are excluded from the group before the sum or aggregate spectrum of the group is computed. Testing for outliers may involve a threshold test with a similar distance measure that is used in grouping or a statistical test based on the Poissonian counting statistics of X-ray spectra. Excluded pixels may be omitted from a final display to avoid giving false information to the observer. Alternatively, the influence of rogue pixel data can be reduced by first calculating the average data vector a for the whole group $g_p$ then recalculating a new weighted average where the weighting for $a_j$ is strongly reduced when $a_j$ is very different from $\bar{a}$. For example, a suitable weighting for $a_j$ is proportional to exp $(-\Sigma[(a_{jk}-\bar{a}_k)^2/(2\sigma_{jk}^2)])$ where the sum is over k from 1 to $L_a$, and $\sigma_{jk}^2$ is the expected variance for the k'th component of the spectral vector $a_j$. An different method of weighting is to use the same principle but using the data vectors from M so that the weighting for $a_j$ is proportional to exp $(-\Sigma[(m_{jr}-m_r)^2/2\sigma_{jr}^2)])$ where the sum is over r from 1 to $L_m$, $\sigma_{jr}^2$ is the expected variance for the $r^{th}$ component of the data vector $m_i$ and tri is the mean data vector for the group $g_p$. If the grouping algorithm has incorporated rogue pixels in a group, this weighting will penalise outliers that cannot be explained by statistical variation alone and give a more appropriate average spectrum for the group.

The spectrum $a_p$ can be processed to correct for artefacts, bremsstrahlung background and peak overlaps so that the area for a peak characteristic of a particular element q can be determined (e.g. using techniques described in Statham. J. Res. Natl. Inst. Stand. Technol. 107, 531-546 (2002)). Furthermore, when the areas of all elemental peaks are determined, the material composition in terms of mass fractions of constituent elements may be determined using the well-known procedures of electron probe microanalysis (e.g. as described in Goldstein et al, "Scanning Electron Microscopy and X-ray Microanalysis" ISBN: 0-306-47292-9). Thus an intensity value $I_q$ for element q, that either corresponds to an intensity of characteristic X-ray emission for that element or to mass fraction of that element, can be determined that is representative of all pixels in the group $g_p$ and this intensity value is then copied into pixel locations and preferably every pixel location of the group $g_p$ within the output image, $E_q$, for element q The optional step to deal with "rogue" pixels may not have been used or may not be perfect and could leave image pixels that are inconsistent with the input data. It may be preferable to exclude such pixels before display, rather than show misleading information. For example, for an element q with a high energy X-ray emission that is sensed by the module and will appear in data M, an element map can be constructed directly from M by processing the data vector $m_j$ for each pixel j to extract the intensity of the X-ray emission for element q at pixel j. If this intensity is deemed insignificant (e.g. because it is within the range of likely random or systematic error) but the output image $E_q$ shows a significant contribution at the same pixel j, then this inconsistent pixel can be excluded by setting intensity to zero within $E_q$. A similar consistency check could be applied using the accessory data A but that will not be so effective because the random statistical errors will be much larger than for M except for elements with low energy X-ray emissions. The statistical error in A can be reduced by aggregating data vectors in the neighbourhood of pixel j. This "data smoothing" or "local averaging" process will blur the data spatially so there is a trade-off between spatial resolution and statistical noise that depends on how large a neighbourhood is used for the aggregation.

The overall output is a set of c digital images, $E_q$ (q=1,c) each image corresponding to a chemical element q of interest and consisting of n pixels where the intensity value for pixel i in image $E_q$ corresponds to either an X-ray emission intensity or a material concentration (e.g. mass fraction) for element q. An additional image may be created where pixels and preferably all pixels in a particular group are assigned a specific colour that represents a phase and this coloured image can be combined as an overlay with a monochrome electron image to highlight regions of different chemical composition in a different colour. Likewise, the digital images $E_q$ (q=1,c) may be assigned suitable colours for overlay with an electron image, using techniques such as those described in PCT/GB2011/051060 or U.S. Pat. No. 5,357,110 for example.

Figure 21:
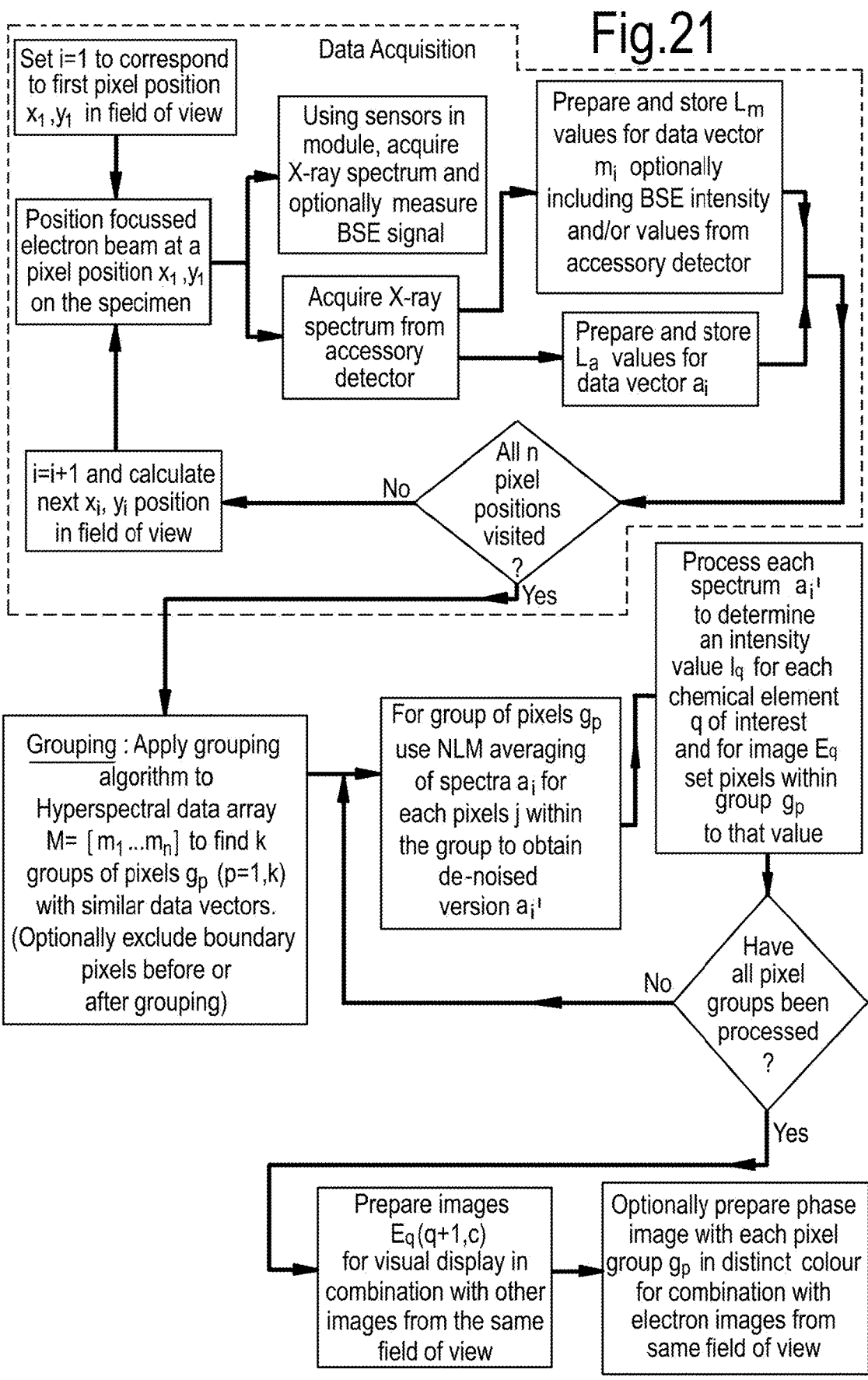
FIG. 21 is a flow diagram depicting a second example data acquisition process according to the invention.

In FIG. 21 an alternative procedure is described. The data acquisition and grouping steps are the same as in FIG. 20. Instead of obtaining a single aggregate spectrum for a group of similar pixels, the principle of non-local means (NLM) averaging is to denoise all the individual pixel spectra within group $g_p$ (see for example, Manjon et al "Multispectral MRI de-noising using non-local means". In Proc. MIUA'07, pages 41-45, Aberystwyth, Wales, 2007). This averaging involves weighting spectra according to a similarity function based on the difference between spectra and is only applied to pixels within the same group obtained by the grouping algorithm. For example, to find a new "denoised" version $a_j'$ of spectrum $a_j$ within group $g_p$ a weighted average is taken including all other spectra such as $a_i$ within the group using weighting factors proportional to $\exp(-\Sigma[(a_{jk}-a_{ik})^2/(2\,(\sigma_{jk}^2+\sigma_{ik}^2))])$ where the sum is over k from 1 to $L_a$ and $\sigma_{jk}^2$ is the expected variance for the k'th component of the spectral vector $a_j$. An alternative weighting scheme for denoising is to use the data vector based primarily on the module data so that the weights are proportional to $\exp(-\Sigma[(m_{jr}-m_{ir})^2/2\,(\sigma_{jr}^2+\sigma_{ir}^2))])$ where the sum is over r from 1 to $L_m$, and $\sigma_{jr}^2$ is the expected variance for the $r^{th}$ component of the data vector $m_j$. As with the procedure of FIG. 18, additional steps may be added to reduce the influence of outlier data due to rogue pixels that have been included erroneously in a group as a result of the grouping process.

The following shows an example of results achieved with the invention. A module is fitted with X-ray sensors that are each covered by a filter consisting of a 6-micron thickness of Mylar. The sensors subtend a total solid angle of 0.438 sterad at the specimen. An accessory X-ray detector fitted with an electron trap is mounted on a port on the side of the electron column and subtends a solid angle of 0.044 sterad at the specimen. A 20 keV focussed electron beam is rastered over an approximately square region of the specimen approximately 200 microns in width and spectra are recorded from both module sensors and accessory detector at each pixel position to build corresponding 256×256-resolution hyperspectral image datasets. The average photon count rate received by the module sensors is 1250 kcps while that for the accessory detector is only 125 kcps because of the smaller solid angle.

Figure 22:
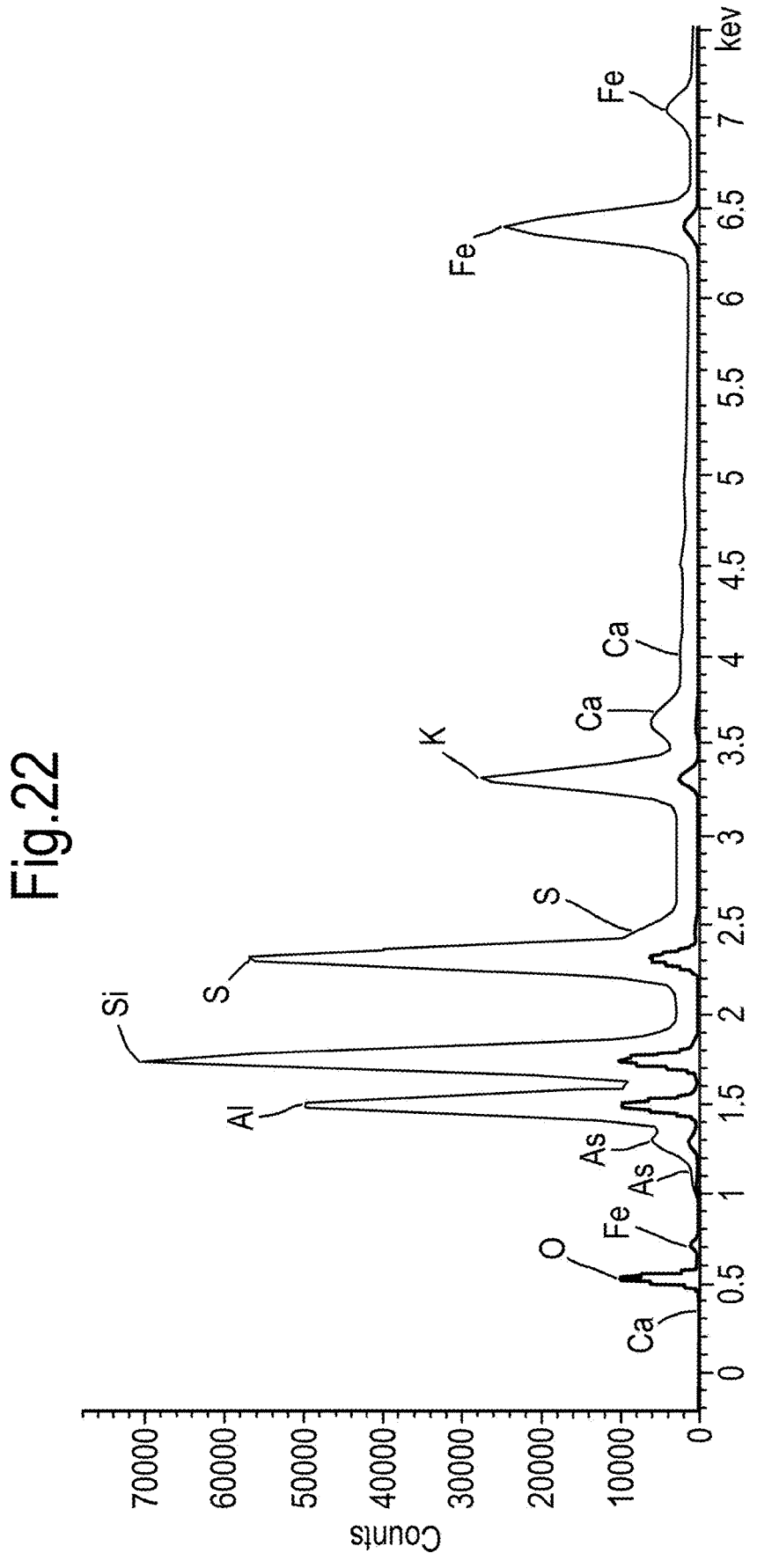
FIG. 22 is a graph showing an X-ray sum spectrum for module data (solid black area) overlayed with a sum spectrum for accessory detector data (lighter line)

Data is acquired with the beam covering all 256×256 pixel positions in a total of 2 seconds. Each spectrum is effectively an energy histogram with 1024 energy bins that are 20 eV wide. A "sum spectrum" is formed by summing the counts in each bin for every pixel in the field of view and FIG. 22 shows the sum spectrum for the module data in comparison to the sum spectrum for the accessory detector data. The module data has approximately 10 times higher counts than the accessory data but has hardly any counts below 1 keV in energy whereas the accessory data has a significant characteristic peak corresponding to Oxygen (O Kα) near 0.5 keV energy because it has an electron trap and does not need a material filter to block BSEs.

Figure 23:
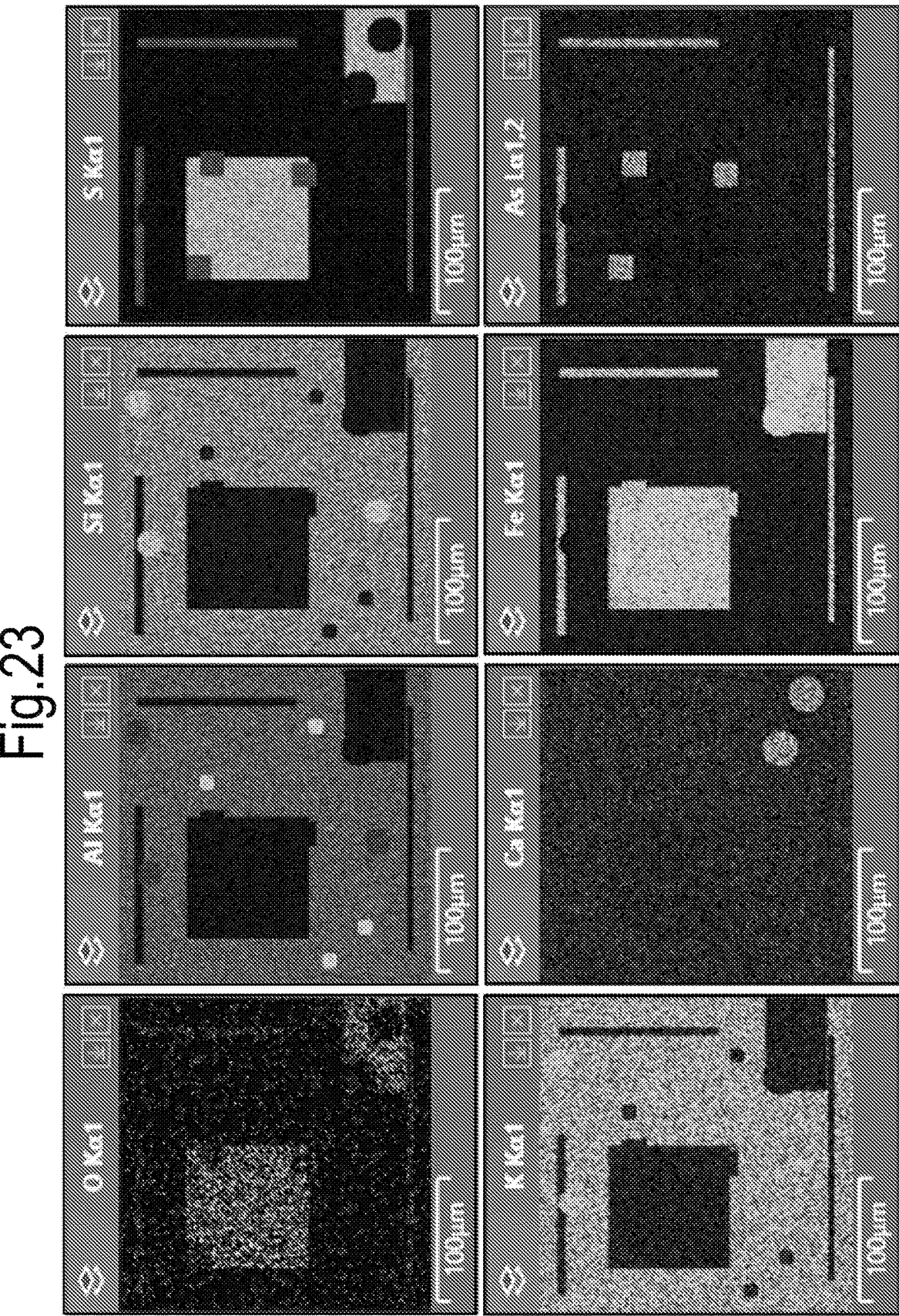
FIG. 23 shows element distribution maps from an example module X-ray data.
Figure 24:
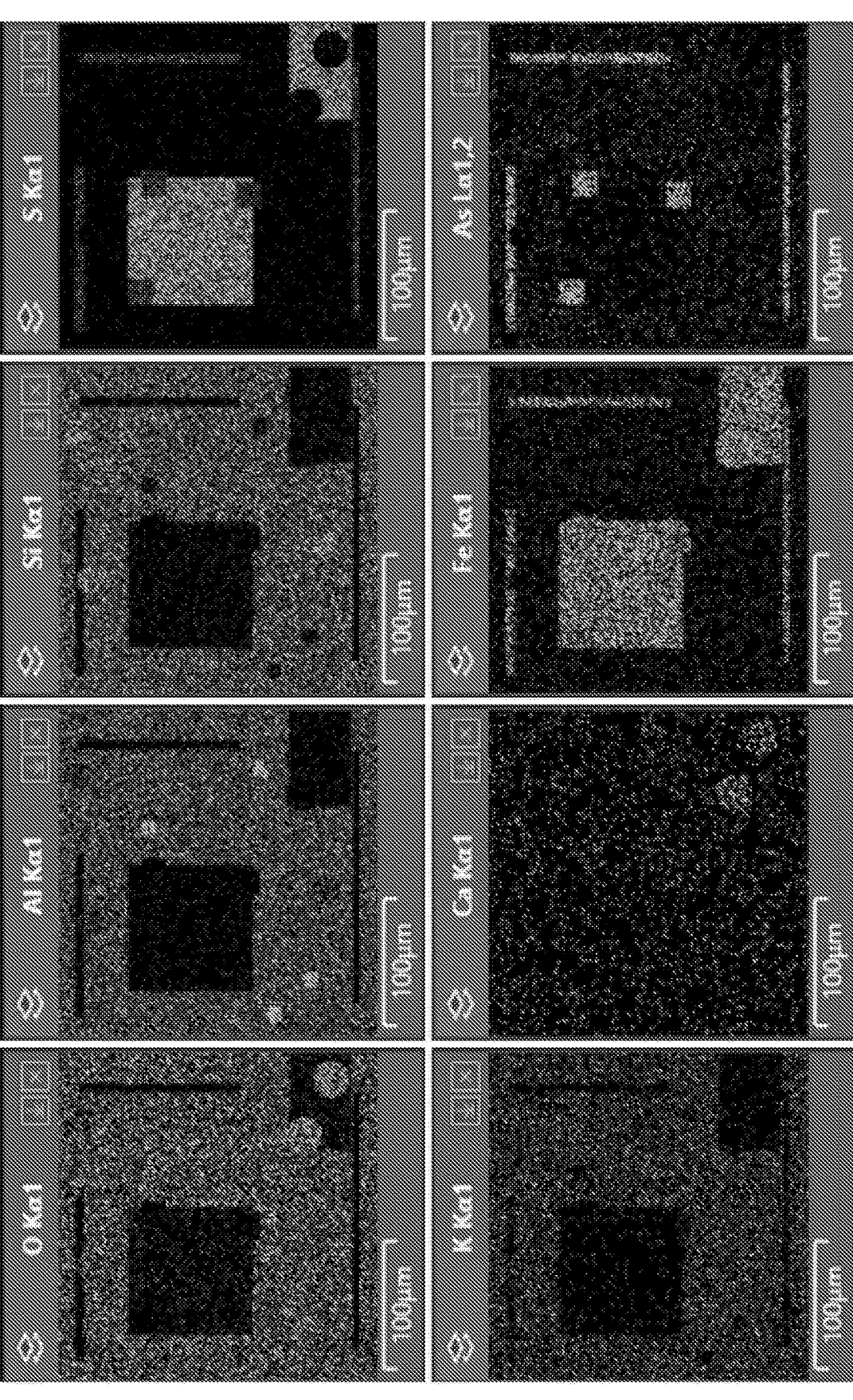
FIG. 24 shows element distribution maps from the an example apparatus including an accessory detector.

In conventional X-ray mapping, for each element of interest, counts are summed for all channels falling within an energy range straddling the main characteristic emission peak in the spectrum. The total counts for an element at a pixel position govern the intensity of the displayed pixel. FIG. 23 shows conventional X-ray maps obtained from the module hyperspectral data set for a series of elements that give peaks in the sum spectrum. The intensity in the maps has been brightness adjusted so that the detail in low count level maps is still visible. There appear to be regions of higher oxygen content visible in the oxygen map (O Kα1) even though the module sensors are irresponsive to such low energy X-rays and the map would be expected to have virtually no counts. The intensity that is observed is due to an artefact called the "silicon escape effect" where a small percentage of photons absorbed in a silicon-based sensor do not convert all the photon energy into charge because a Si Kα photon escapes out of the sensor. Thus, a small fraction of sulphur S Kα emissions at 2.31 keV, which do pass easily through the mylar filter, appear as an artefact in the spectrum at 0.57 keV and therefore fall within the energy range used for mapping the O Kα1 intensity. Consequently, the O Kα1 map, which would normally be blank, is showing an artefact that follows the same distribution of material that emits S Kat and therefore looks like the S Ka1 map. FIG. 24 shows corresponding element distribution maps derived from the accessory detector hyperspectral data set. Most of the element maps have much fewer counts than in FIG. 23 and a higher level of statistical (Poissonian) noise and thus worse S/N. The exception is the O Kα1 map, which although still noisy, does show the true distribution of material containing oxygen.

Figure 25:
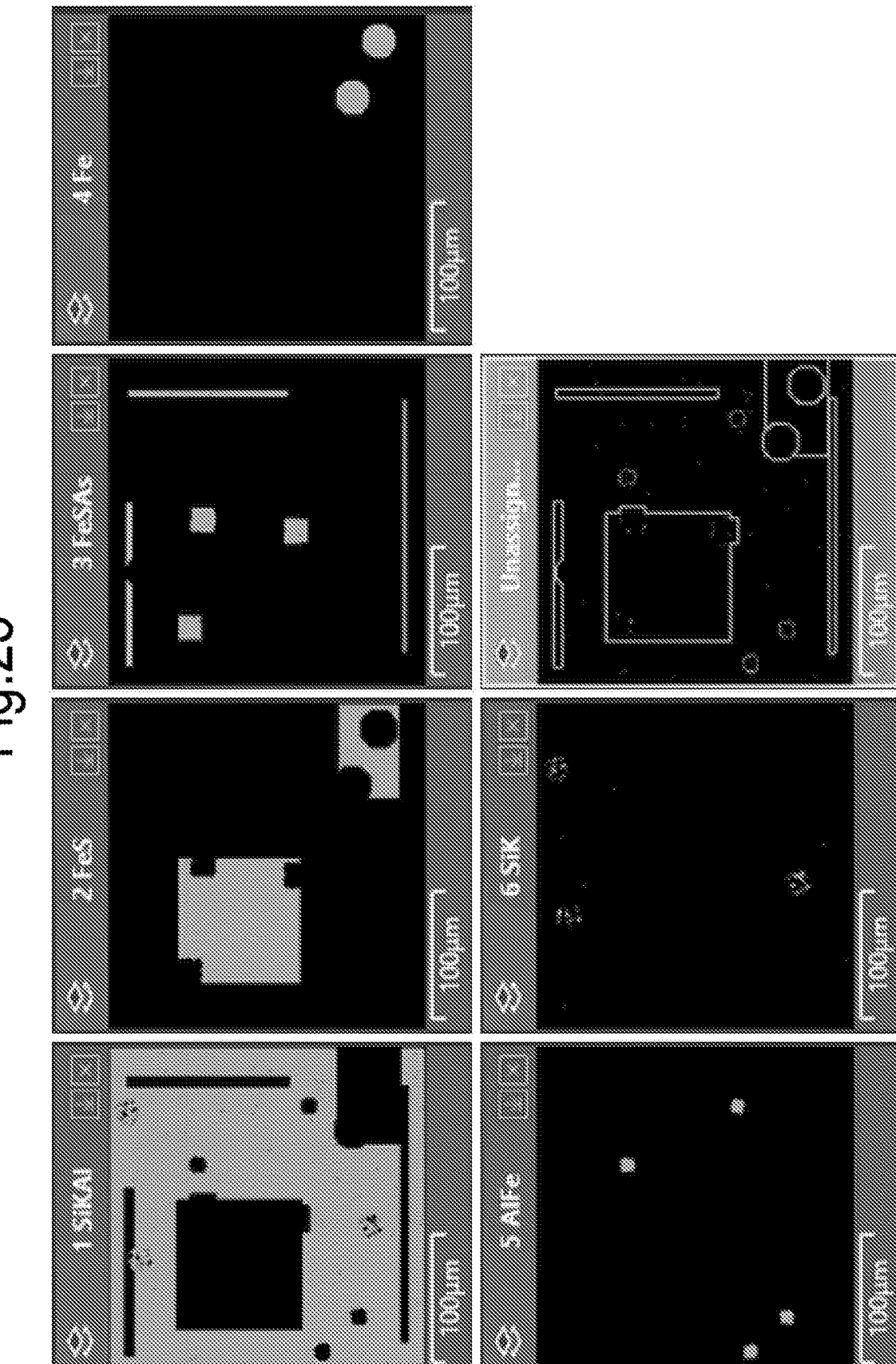
FIG. 25 shows "phase" distributions for pixels with similar spectra in the example module data set.

The X-ray map data from the module is used as input to a grouping algorithm (Statham et al, Microsc. Microanal. 19 (Suppl 2), 2013, p 752) that finds groups of data vectors, in this case X-ray spectra from the module, that are similar. The algorithm finds 6 distinct groups and the pixels within each of those groups are shown as "phase" distributions in FIG. 25. The image entitled "Unassign." shows the boundary pixels that are identified by the algorithm and are not assigned to any group.

For each "phase", for preferably all pixel positions within the phase, the X-ray spectra from the accessory detector hyperspectral data set is summed to produce a single spectrum representative of the phase. It may be necessary to exclude some pixels, for example pixels adjacent to a boundary, as these may be less representative of the true material composition. This may occur if the region of X-ray emission extends beyond the dimensions of a single pixel for example. The single spectrum is processed to correct for artefacts, background and peak overlaps to determine the intensities of the characteristic X-ray emissions and these intensities are then used as input to an algorithm to correct for the various effects of electron scattering, X-ray generation, X-ray absorption within the specimen and efficiency of X-ray detection in order to estimate the mass fraction for each element in the material responsible for that spectrum. When a "phase" has had its chemical content quantified, the mass fraction for an element in the phase is used to control the intensity value to use at pixel positions for that "phase" in an output distribution image for that element.

Figure 26:
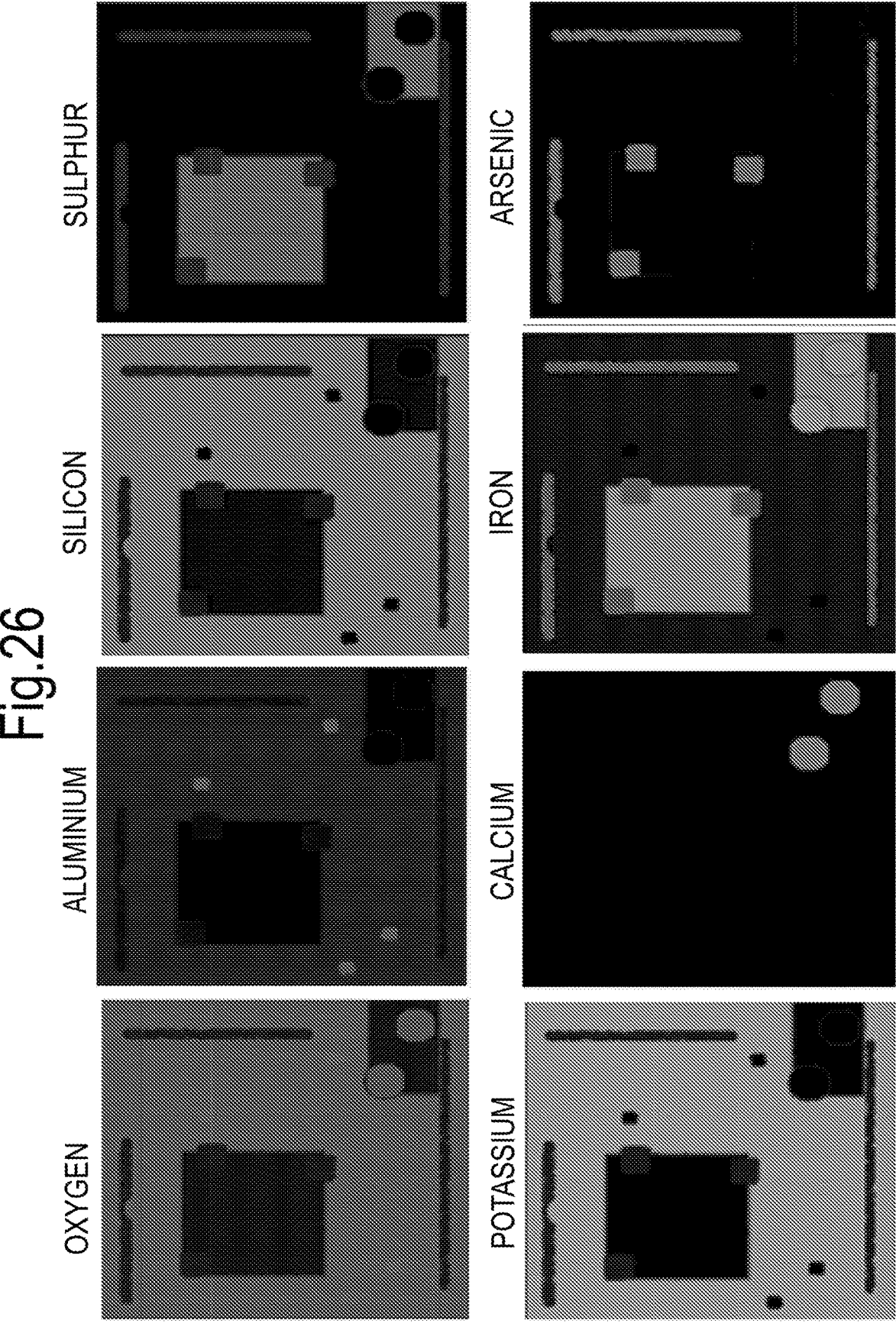
FIG. 26 shows element distributions calculated from the concentration results from accessory detector data for the phases shown in FIG. 23.
Figure 27:
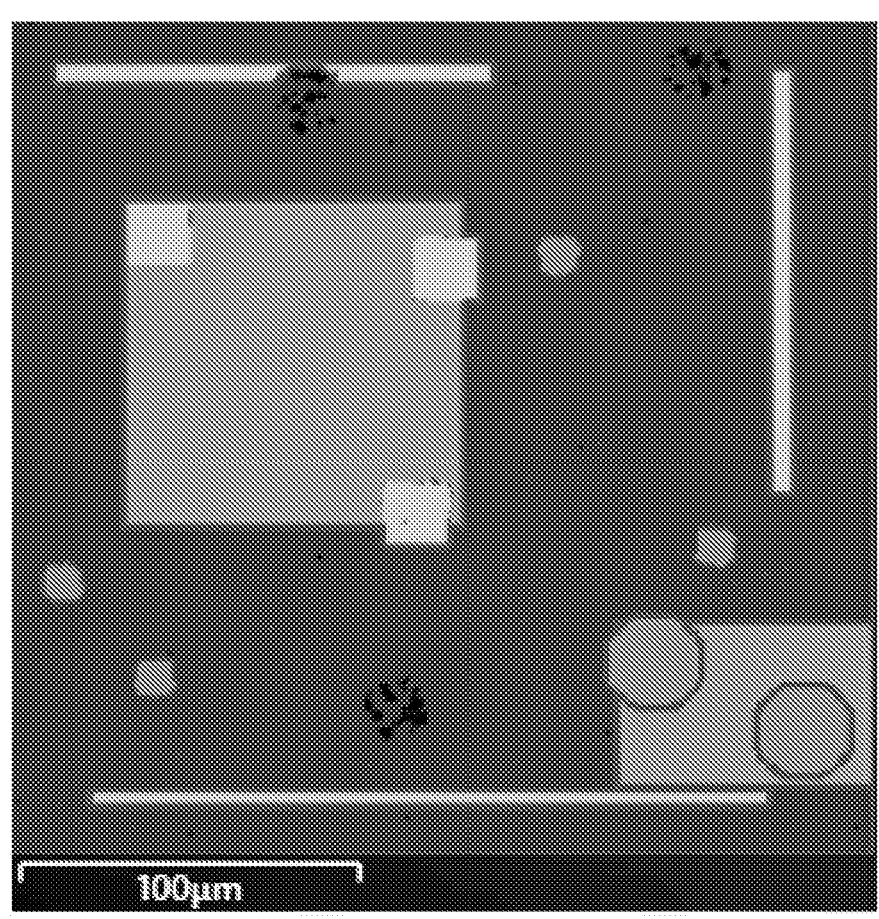
FIG. 27 shows a "phase" map depicting distribution of different materials, in which individual colours are typically assigned to each phase for display which may be overlaid on top of the corresponding electron image acquired from the same region of the specimen.

FIG. 26 shows the final element distribution images generated by this procedure. The S/N of these images is much higher than those for the original accessory detector maps shown in FIG. 24. The delineation of regions of different composition is much sharper than can be achieved with accessory detector data alone and reflects the reduced statistical noise in the data from the module. FIG. 27 shows a "phase" map showing distribution of different materials obtained by combining the individual phase distributions of FIG. 25. Individual colours are typically assigned to each phase for display which may be overlaid on top of the corresponding electron image acquired from the same region of the specimen.

The invention may be further understood by reference to the following numbered clauses:

Clause 1. An apparatus for analysing a specimen comprising:

an electron beam assembly for generating a focused electron beam;

a first detector for detection of photons that includes X-ray sensor elements wherein the X-ray sensor elements subtend a first total solid angle at the point where the electron beam strikes the specimen;

a second detector for detection of photons that includes X-ray sensor elements wherein the X-ray sensor elements subtend a second total solid angle at the point where the electron beam strikes the specimen:

wherein both detectors receive X-rays generated by the interaction between the electron beam and the specimen and the X-ray sensor elements can be used to detect individual photons and measure their energies:

wherein the first total solid angle is at least three times greater than the second total solid angle;

where spectral data from first and second detectors are recorded as the electron beam is scanned over a region of the specimen;

spectral data from the first detector and optionally data from the second detector are used to identify sub regions where the recorded signals are similar for points within a given sub region;

spectral data from the second detector for a number of positions, preferably all positions, within a sub region are combined to produce a single spectrum representative of the material within that sub region;

the representative spectrum for a sub region is processed to determine the intensity values for one or more characteristic elemental X ray emissions and optionally, the concentrations of the corresponding elements responsible for those emissions;

image data are assembled for one or more elements by assigning the value of intensity or concentration for an element derived from the sub region representative spectrum to points, preferably every image point, within a sub region;

the assembled image data for an element for identified sub regions is used to provide a visual representation of element distribution over the region of the specimen.

Clause 2. Apparatus according to clause 1, wherein the data for points within an identified sub region are inspected before the spectral data from the second X-ray detector are combined in order to exclude points from the sub region for which the point data is outside the expected range of variation for the points in the sub region.

Clause 3. Apparatus according to clause 1 or clause 2, wherein the spectral data from the second X-ray detector for points within an identified sub region are aggregated to produce a single spectrum for the sub region by using a weighted combination of spectra where the weight for a spectrum depends on a measure of the difference between that spectrum and the average spectrum for the whole sub region.

Clause 4. A method for analysing a specimen using apparatus that comprises:

an electron beam assembly for generating a focused electron beam;

a first detector for detection of photons that includes X-ray sensor elements wherein the X-ray sensor elements subtend a first total solid angle at the point where the electron beam strikes the specimen;

a second detector for detection of photons that includes X-ray sensor elements wherein the X-ray sensor elements subtend a second total solid angle at the point where the electron beam strikes the specimen:

wherein both detectors receive X-rays generated by the interaction between the electron beam and the specimen and the X-ray sensor elements can be used to detect individual photons and measure their energies:

wherein the first total solid angle is at least three times greater than the second total solid angle;

the method comprising:

wherein spectral data from first and second detectors are recorded as the electron beam is scanned over a region of the specimen;

spectral data from the first detector and optionally data from the second detector are used to identify sub regions where the recorded signals are similar for points within a given sub region;

spectral data from the second detector for a number of positions, preferably all positions, within a sub region are combined to produce a single spectrum representative of the material within that sub region;

the representative spectrum for a sub region is processed to determine the intensity values for one or more characteristic elemental X ray emissions and optionally, the concentrations of the corresponding elements responsible for those emissions;

image data are assembled for one or more elements by assigning the value of intensity or concentration for an element derived from the sub region representative spectrum to points, preferably every image point, within a sub region;

the assembled image data for an element for identified sub regions is used to provide a visual representation of element distribution over the region of the specimen.

Clause 5. A method according to clause 4 wherein the data for points within an identified sub region are inspected before the spectral data from the second X-ray detector are combined in order to exclude points from the sub region for which the point data is outside the expected range of variation for the points in the sub region.

Clause 6. A method according to clause 4 or 5 wherein the spectral data from the second X-ray detector for points within an identified sub region are aggregated to produce a single spectrum for the sub region by using a weighted combination of spectra where the weight for a spectrum depends on a measure of the difference between that spectrum and the average spectrum for the whole sub region.

Clause 7. An apparatus for analysing a specimen, the apparatus comprising:

an electron beam assembly for generating a focused electron beam;

a first detector for detection of photons that includes X-ray sensor elements wherein the X-ray sensor elements subtend a first total solid angle at the point where the electron beam strikes the specimen;

a second detector for detection of photons that includes X-ray sensor elements wherein the X-ray sensor elements subtend a second total solid angle at the point where the electron beam strikes the specimen:

wherein both detectors receive X-rays generated by the interaction between the electron beam and the specimen and the X-ray sensor elements can be used to detect individual photons and measure their energies:

wherein the first total solid angle is at least three times greater than the second total solid angle;

where spectral data from first and second detectors are recorded as the electron beam is scanned over a region of the specimen;

spectral data from the first detector and optionally data from the second detector are used to identify sub regions where the recorded signals are similar for points within a given sub region;

for sub regions, preferably every sub region, spectral data from the second X-ray detector for each point within a sub region are combined by weighted averaging with data from other points, preferably all other points, in the sub region to produce a denoised version of the spectrum at that point;

the denoised spectrum for each point is processed to determine the intensity values for one or more characteristic elemental X ray emissions and optionally, the concentrations of the corresponding elements responsible for those emissions;

image data are assembled for one or more elements by assigning the value of intensity or concentration for an element derived from the denoised spectrum to image points, preferably every image point;

the assembled image data for an element is used to provide a visual representation of element distribution over the region of the specimen.

Clause 8. An apparatus according to clause 7, wherein the weighted averaging for the denoised spectrum at a point uses weighting factors for each other point in the sub region that depend on a measure of the difference between the spectrum data from the second X-ray detector or spectrum data from the first X-ray detector for that point and the corresponding second detector or first detector spectrum data for each other point in the sub region.

Clause 9. An apparatus according to clause 7 or clause 8, wherein the data for points within an identified sub region are inspected in order to exclude points from the sub region for which the point data is outside the expected range of variation for the points in the sub region.

Clause 10. A method for analysing a specimen using apparatus that comprises:

an electron beam assembly for generating a focused electron beam;

a first detector for detection of photons that includes X-ray sensor elements wherein the X-ray sensor elements subtend a first total solid angle at the point where the electron beam strikes the specimen;

a second detector for detection of photons that includes X-ray sensor elements wherein the X-ray sensor elements subtend a second total solid angle at the point where the electron beam strikes the specimen:

wherein both detectors receive X-rays generated by the interaction between the electron beam and the specimen and the X-ray sensor elements can be used to detect individual photons and measure their energies:

wherein the first total solid angle is at least three times greater than the second total solid angle;

where spectral data from first and second detectors are recorded as the electron beam is scanned over a region of the specimen;

the method comprising spectral data from the first detector and optionally data from the second detector are used to identify sub regions where the recorded signals are similar for points within a given sub region;

for sub regions, preferably every sub region, spectral data from the second X-ray detector for each point within a sub region are combined by weighted averaging with data from other points, preferably all other points, in the sub region to produce a denoised version of the spectrum at that point;

the denoised spectrum for each point is processed to determine the intensity values for one or more characteristic elemental X ray emissions and optionally, the concentrations of the corresponding elements responsible for those emissions;

image data are assembled for one or more elements by assigning the value of intensity or concentration for an element derived from the denoised spectrum to image points, preferably every image point;

the assembled image data for an element is used to provide a visual representation of element distribution over the region of the specimen.

Clause 11. A method according to clause 10, wherein the weighted averaging for the denoised spectrum at a point uses weighting factors for each other point in the sub region that depend on a measure of the difference between the spectrum data from the second X-ray detector or spectrum data from the first X-ray detector for that point and the corresponding second detector or first detector spectrum data for each other point in the sub region.

Clause 12. A method according to clause 10 or clause 11, wherein the data for points within an identified sub region are inspected in order to exclude points from the sub region for which the point data is outside the expected range of variation for the points in the sub region.

Clause 13. An apparatus for analysing a specimen within a scanning electron microscope comprising
a detector module for detection of backscattered electrons
wherein the detector module is positioned immediately below the polepiece for the final lens of the electron beam assembly that the electron beam passes through before striking the specimen
wherein an optical camera is fitted into the module and the camera has a field of view of the specimen at least 10 mm across with a camera to specimen distance of less than 10 mm and, optionally, the depth of field of the camera is sufficient to allow the width of the field of view to be increased to at least 20 mm, and ideally more than 60 mm, by increasing the camera to specimen distance.

Clause 14. An apparatus according to clause 13, wherein two optical cameras are fitted into the module and the cameras' fields of view of the specimen overlap and, optionally, the two images can be used to provide a stereoscopic display of the specimen and/or the data from the cameras can be used to calculate a topographic map of the specimen surface.

The invention claimed is:

1. A detector module for use in an apparatus for analysing a specimen,
the detector module comprising a plurality of X-ray sensor elements and one or more electron sensor elements,
wherein the detector module is adapted to be positioned below a polepiece of an electron beam assembly of the apparatus from which an electron beam generated by the assembly emerges towards a specimen in use, and shaped so as to at least partially surround the electron beam, such that the detector module receives X-rays and backscattered electrons generated by interaction between the electron beam and the specimen,
and wherein each of the plurality of X-ray sensor elements is configured to monitor energies of individual received X-ray photons,
and wherein the plurality of X-ray sensor elements have a total active area greater than 20 mm$^2$, and
the radial extent of the detector module with respect to the electron beam axis in use is less than 10 mm for at least a first portion of the detector module so as to provide an unobstructed line of sight to the spot at which the electron beam strikes the specimen, for an accessory device when positioned to one side of the electron beam assembly in use.

2. A detector module according to claim 1, wherein the radial extent of the first portion of the detector module is less than 7 mm, or more preferably less than 5 mm.

3. A detector module according to claim 1, wherein more than half of the total active area of the plurality of X-ray sensor elements is less than 6 mm from the electron beam axis.

4. A detector module according to claim 1, wherein the one or more electron sensor elements have a total active area greater than 30 mm$^2$.

5. A detector module according to claim 1, wherein the X-ray sensor elements are disposed with no more than two-fold rotational symmetry about the electron beam axis in use, and the one or more electron sensor elements are disposed with at least two-fold rotational symmetry about the electron beam axis in use.

6. A detector module according to claim 1, wherein
a radial distance from the electron beam axis to a first location within the active area of the one or more electron sensor elements is greater than the maximum radial extent with respect to the electron beam axis in use of the active area of the plurality of X-ray sensor elements, and
a radial distance from the electron beam axis to a second location within the active area of the one or more electron sensor elements is less than the minimum radial distance between the electron beam axis in use and the active area of the plurality of X-ray sensor elements.

7. A detector module according to claim 6, configured such that the signal from a first portion of the active area of the one or more electron sensor elements that is positioned furthest from the electron beam axis in use is amplified before it is added to the signal from a second portion of the active area of the one or more electron sensor elements, different from the first portion.

8. A detector module according to claim 1, further comprising one or more material layers disposed on or over at least a portion of the active area of the plurality of X-ray sensor elements and adapted to block the transmission of any one or more of electrons, visible light, and infra-red radiation while allowing transmission of X-rays having energies within a first range of energies.

9. A detector module according to claim 8, wherein one of the one or more material layers is a coating applied to a surface of the said portion of the active area of the plurality of X-ray sensor elements.

10. A detector module according to claim 8, wherein one of the one or more material layers is electrically grounded or connected to a fixed voltage supply and is electrically conductive so as to prevent the electric potential of the material layer increasing owing to electrostatic charging attributable to incident electrons.

11. A detector module according to claim 1, where each of the plurality of X-ray sensor elements is arranged behind an aperture in a conductive plate configured to function as a first electrode of a capacitive sensor adapted to monitor the proximity of the specimen and/or a specimen holder.

12. A detector module according to claim 1, further comprising an optical camera arranged to have a field of view of the specimen at least 10 mm across, with a camera-to-specimen distance of less than 10 mm and, optionally, wherein a depth of field of the camera is sufficient to allow the width of the field of view to be increased to at least 20 mm, or preferably more than 60 mm, by increasing the camera-to-specimen distance.

13. A detector module according to claim 1, comprising a first optical camera and a second optical camera having respective first and second fields of view of the specimen that at least partially overlap, and, optionally, wherein first and second optical cameras are arranged such that first and second images captured respectively thereby can be used to provide a stereoscopic display of the specimen, and/or data from the cameras can be used to generate a topographic map of the specimen surface.

14. An apparatus for analysing a specimen, the apparatus comprising:

an electron beam assembly for generating a focused electron beam; and a detector module according to claim 1, the apparatus further comprising an accessory device mounted to the electron beam assembly, wherein the orientation of the detector module with respect to the electron beam assembly is such that at least a part of the first portion of the detector module and at least a part of the accessory device coincide with a plane within which the electron beam axis lies, wherein the first portion is positioned between the electron beam axis and the accessory device in use.

15. An apparatus according to claim 14, further comprising an accessory device comprising an X-ray detector fitted with electron trap.

16. A method of analysing a specimen, the method comprising:

using an electron beam assembly to generate a focused electron beam; and providing a detector module comprising a plurality of X-ray sensor elements and one or more electron sensor elements, wherein the detector module is positioned below a polepiece of the electron beam assembly from which the focused electron beam emerges towards the specimen and shaped so as to at least partially surround the electron beam, such that the detector module receives X-rays and backscattered electrons generated by interaction between the electron beam and the specimen, and monitoring, using the plurality of X-ray sensor elements, energies of individual received X-ray photons, wherein the plurality of X-ray sensor elements have a total active area greater than 20 mm$^2$, and the radial extent of the detector module with respect to the electron beam axis is less than 10 mm for at least a first portion of the detector module so as to provide an unobstructed line of sight to the spot at which the electron beam strikes the specimen, for an accessory device when positioned to one side of the electron beam assembly in use.

* * * * *